United States Patent
Takeuchi et al.

(10) Patent No.: US 6,335,586 B1
(45) Date of Patent: Jan. 1, 2002

(54) PIEZOELECTRIC/ELECTROSTRICTIVE DEVICE AND PRODUCTION METHOD THEREOF

(75) Inventors: Yukihisa Takeuchi, Nishikamo-Gun; Tsutomu Nanataki, Toyoake; Toshikazu Hirota, Kuwana; Koji Kimura, Nagoya, all of (JP)

(73) Assignee: NGK Insulators, Ltd., Nagoya (JP)

(*) Notice: Subject to any disclaimer, the term of this patent is extended or adjusted under 35 U.S.C. 154(b) by 0 days.

(21) Appl. No.: 09/441,914

(22) Filed: Nov. 17, 1999

Related U.S. Application Data

(63) Continuation-in-part of application No. 09/242,642, filed on Dec. 28, 1998, now Pat. No. 6,239,534.

(30) Foreign Application Priority Data

| Oct. 1, 1999 | (JP) | 11-281522 |
| Oct. 28, 1999 | (JP) | 11-307844 |
| Nov. 16, 1999 | (JP) | 11-326195 |

(51) Int. Cl.$^7$ ............................................. H01L 41/08
(52) U.S. Cl. ........................................ 310/330; 310/328
(58) Field of Search ................................. 310/321, 328, 310/330, 331, 332

(56) References Cited

U.S. PATENT DOCUMENTS

| 6,109,104 A | * 8/2000 | Fukuda et al. | 73/504.13 |
| 6,140,739 A | * 10/2000 | Arai et al. | 310/321 |

FOREIGN PATENT DOCUMENTS

| JP | 63-64640 | 3/1966 |
| JP | 10-136665 | 5/1998 |

OTHER PUBLICATIONS

Piezoelectric Piggy–Back Microactuator for Hard Disk Drive. Yoshikazu Soeno et al., IEEE Transactions on Magnetics. vol. 35, No. 2, Mar. 1999, pp. 983–987.

Dual Stage Actuator System for Magnetic Disk Drives Using a Shear Mode Piezoelectric Microactuator S. Koganezawa et. al. IEEE Transactions on Magnetics. vol. 35, No. 2, Mar. 1999, pp. 988–992.

* cited by examiner

Primary Examiner—Mark O. Budd
(74) Attorney, Agent, or Firm—Burr & Brown

(57) ABSTRACT

A piezoelectric/elecrostrictive device comprising a driving portion to be driven by a displacement of a piezoelectric/electrostrictive element, a movable portion to be operated based on a drive of the driving portion, and a fixing portion for holding the driving portion and the movable portion. The driving portion comprises a pair of thin plate portions facing each other, and a film-like piezoelectric/electrostrictive element including at least a pair of electrode films and a piezoelectric/electrostrictive film formed at least on the outer surface of at least one thin plate portion of the thin plate portions. The fixing portion is coupled with the movable portion via the driving portion, a hole is defined by an inner wall of the driving portion, an inner wall of the movable portion, and an inner wall of the fixing portion, and at least one side of a piezoelectric operating portion of said piezoelectric/electrostrictive element in a direction in which said thin plate portion connects with said fixing portion with the movable portion is structured to exist on the fixing portion or the movable portion. A ratio a/b of the thickness a of said hole and the width b of said thin plate portion is 0.5 to 20. Since the movable portion can be largely operated, the device can be used as a displacement element which is hardly affected by a harmful vibration in operation, and superior in mechanical strength, handling property, impact resistance, and humidity resistance, and a sensor element capable of detecting a vibration of the movable portion with fine precision.

45 Claims, 29 Drawing Sheets

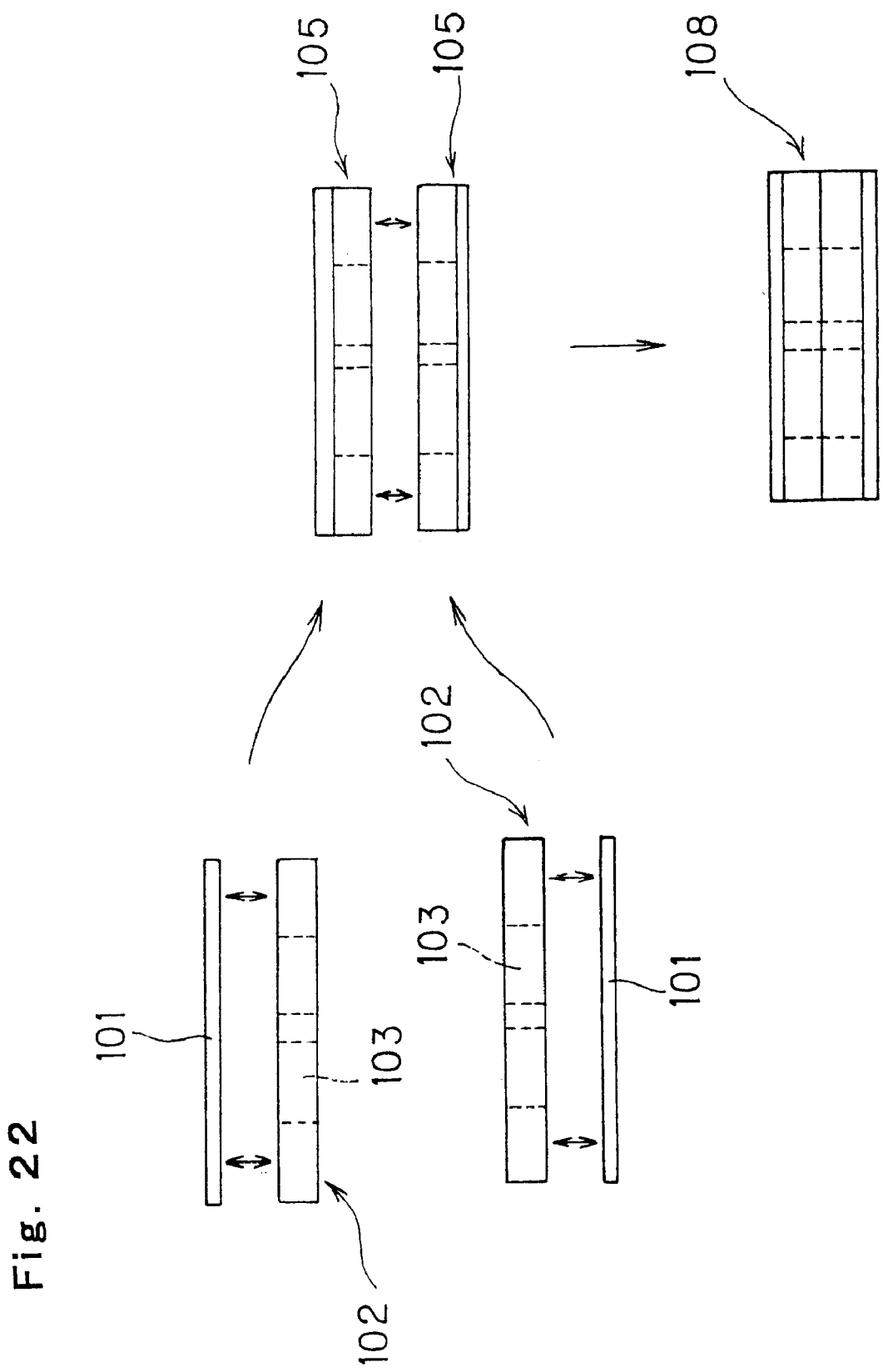

Fig. 32
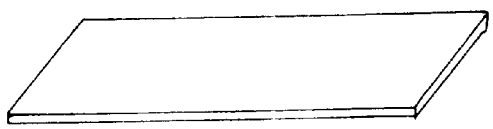
CERAMIC GREEN SHEET 2
FOR THIN PLATE
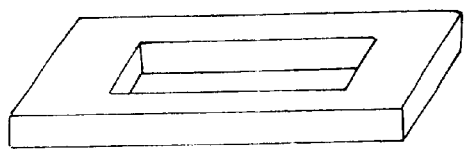
HOLED CERAMIC GREEN SHEET 4
HOLED CERAMIC GREEN SHEET 3
HOLED CERAMIC GREEN SHEET 2
HOLED CERAMIC GREEN SHEET 1
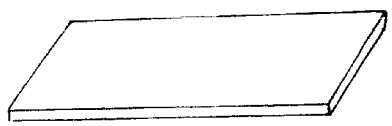
CERAMIC GREEN SHEET 1
FOR THIN PLATE

PIEZOELECTRIC/ELECTROSTRICTIVE DEVICE AND PRODUCTION METHOD THEREOF

CROSS REFERENCE TO RELATED APPLICATION

This application is a Continuation-in-Part application of U.S. application Ser. No. 09/242,642, filed Dec. 28, 1998, now U.S. Pat. No. 6,239,534, the entirety of which is incorporated herein by reference.

BACKGROUND OF THE INVENTION AND RELATED STATEMENT

The present invention relates to a piezoelectric/electrostrictive device having a movable portion to be operated based on a displacement of a piezoelectric/electrostrictive element, or a piezoelectric/electrostrictive device capable of detecting a displacement of the movable portion by the piezoelectric/electrostrictive element, and more particularly relates to a piezoelectric/electrostrictive device which is superior in mechanical strength, impact resistance, and humidity resistance and can efficiently operate the movable portion in a large magnitude.

Recently, in a field of optics or magnetic recording, precision machining, or the like, a displacement element capable of adjusting an optical path length and a position in sub-micron order has been required, and development has progressed of a displacement element utilizing a displacement due to the inverse piezoelectric effect or electrostrictive effect obtained when a voltage is applied to a piezoelectric/electrostrictive material (for example, a ferroelectric substance or the like). For example, as shown in FIG. 2, a piezoelectric actuator 21 in which a fixing portion 25 and a movable portion 24 and a bridge beam 26 connecting therewith are integrally formed by providing a hole 28 on a board-like body composed of a piezoelectric/electrostrictive material, and an electrode layer 22 is further provided on the bridge beam 26, is disclosed in JP-A-10-136665.

In the actuator 21, when a voltage is applied to an electrode layer 22, the movable portion 24 can have an arc-shaped displacement or a rotational displacement in the plane of the board-like body, since the bridge beam 26 expands or contracts by the inverse piezoelectric effect or electrostrictive effect in a direction connecting the fixing portion 25 with the movable portion 24.

On the other hand, JP-A-63-64640 discloses a technique related to an actuator using a bimorph, wherein the bimorph is provided with divided electrodes such that a divided electrode is selected to drive the actuator to perform precise alignment at a high speed. For example, the specification shows in FIG. 4 a structure which uses two bimorphs positioned opposing to each other.

However, the actuator 21 has a problem that an operational quantity of the movable portion 24 is small, since the displacement in an expanding or contracting direction (namely, the in-plane direction of the board-like body) of a piezoelectric/electrostrictive material is transmitted per se to the movable portion.

Further, the actuator 21 has another problem that the actuator 21, having all the parts thereof constituted with a piezoelectric/electrostrictive material which is fragile and comparatively heavy, is low in mechanical strength, and inferior in handling property, impact resistance and humidity resistance, and further the actuator 21 per se is heavy and is easily influenced by a harmful vibration, for example, residual vibration or vibrational noise during high speed operation.

In order to solve above-described problems of the actuator 21, a proposition is made that a hole 28 is filled with an elastic filler. However, it is apparent that efficiency of the displacement due to the inverse piezoelectric effect or the electrostrictive effect is lowered when the filler is added.

On the other hand, what is shown in FIG. 4 of JP-A-63-64640 is, in bonding of an intermediary member 3 and a bimorph, a bonding of a site without the divided electrodes with the intermediary member, and therefore an advantage of the divided electrodes cannot be utilized at the bonded site. In other words, merely a site of the bimorph which is not a displacement generating portion is bonded. Further, on the other hand, a bonding formed at a bonding site of a head and the bimorph is similar. As a result, a bending displacement of the bimorph is developed toward an inner space between the intermediary member and the head, and the structure is not a type where the head per se is given an operation for effective displacement toward the outside space. In addition, the actuator disclosed in JP-A-63-64640 has a structure where a displacement generating member and a so-called frame member (an intermediary member or the like) are prepared separately, and adhered mutually to unite, thus the structure is liable to change over time the bonding condition of the frame and the bimorph, and also liable to cause drifting of the displacement, exfoliation, or the like. Further, a structure with an adhesive intervened at the bonding site of the bimorph with the intermediary member and at the bonding site of the head with the bimorph, namely at a holding portion of a displacement member, is lower in stiffness at the holding portion per se, thus making it difficult to increase a resonant frequency required for high speed operation.

The present invention is made in view of such problems in the conventional art, and an object thereof is to provide a displacement element which can largely operate a movable portion, and is hardly influenced by a harmful vibration in operation, capable of a high speed response, high in mechanical strength, and superior in handling property, impact resistance, and humidity resistance, as well as a sensor element capable of detecting a vibration of the movable portion in fine precision, and methods of fabricating the elements.

SUMMARY OF THE INVENTION

According to the present invention, firstly provided is a piezoelectric/electrostrictive device comprising a driving portion to be driven by a displacement of a piezoelectric/electrostrictive element, a movable portion to be operated based on a drive of the driving portion, and a fixing portion for holding the driving portion and the movable portion, said piezoelectric/electrostrictive device being characterized in that the driving portion is formed of a pair of thin plate portions facing each other, and a film-like piezoelectric/electrostrictive element including at least a pair of an electrode films and a piezoelectric/electrostrictive film formed on at least a part of the outer surface of at least one thin plate portion of the thin plate portions, the fixing portion is coupled with the movable portion via the driving portion, a hole is defined by an inner wall of the driving portion, an inner wall of the movable portion, and an inner wall of the fixing portion, at least one side of a piezoelectric operating portion of the piezoelectric/electrostrictive element in a direction connecting the fixing portion with the movable portion is structured to exist on the fixing portion or the movable portion, and a ratio a/b of the thickness a of the hole and the width b of the thin plate portion is 0.5 to 20.

Further provided in the present invention are a piezoelectric/electrostrictive device characterized in that the width of the thin plate portion is the same as the width of the piezoelectric/electrostrictive element formed on the thin plate portion; a piezoelectric/electrostrictive device characterized in that a ratio e/a of the length e of the thin plate portion and the thickness a of the hole is 0.5 to 10; a piezoelectric/electrostrictive device characterized in that a ratio a/b of the thickness a of the hole and the width b of the thin plate portion is 1 to 10, and a ratio e/a of the length e of the thin plate portion and the thickness a of the hole is 0.7 to 5; and a piezoelectric/electrostrictive device wherein the movable portion and the fixing portion are a rectangular solid body.

According to the present invention, secondly provided is a piezoelectric/electrostrictive device comprising a driving portion to be driven by a displacement of a piezoelectric/electrostrictive element, a movable portion to be operated based on a drive of the driving portion, and a fixing portion for holding the driving portion and the movable portion, said piezoelectric/electrostrictive device being characterized in that the driving portion is formed of a pair of thin plate portions facing each other and a film-like piezoelectric/electrostrictive element comprising at least a pair of electrode films and a piezoelectric/electrostrictive film formed on at least a part of the outer surface of at least one thin plate portion of the thin plate portions, the fixing portion is coupled with the movable portion via the driving portion, a hole is defined by an inner wall of the driving portion, an inner wall of the movable portion, and an inner wall of the fixing portion, and at least one side of a piezoelectric operating site of the piezoelectric/electrostrictive element in a direction connecting the fixing portion and the movable portion is structured to exist on the fixing portion or the movable portion, the thickness a of the hole is 100 $\mu$m to 2000 $\mu$m, and the width b of the thin plate portion is 50 $\mu$m to 2000 $\mu$m.

Further provided are a piezoelectric/electrostrictive device characterized in that the thickness a of the hole is 200 $\mu$m to 1000 $\mu$m and the width b of the thin plate portion is 100 $\mu$m to 500 $\mu$m; a piezoelectric/electrostrictive device characterized in that the width b of the thin plate portion is larger than the thickness d thereof, and the thickness d is 2 $\mu$m to 100 $\mu$m; a piezoelectric/electrostrictive device characterized in that the length e of the thin plate portion is 200 $\mu$m to 3000 $\mu$m; a piezoelectric/electrostrictive device characterized in that the length f of the movable portion is 50 $\mu$m to 2000 $\mu$m; a piezoelectric/electrostrictive device wherein said piezoelectric/electrostrictive device has at least two driving portions; a piezoelectric/electrostrictive device wherein said piezoelectric/electrostrictive element is a laminated type piezoelectric/electrostrictive element with a lower electrode film, a piezoelectric/electrostrictive film, and an upper electrode film laminated in a layer form; a piezoelectric/electrostrictive device wherein said piezoelectric/electrostrictive element is structured with a piezoelectric/electrostrictive element comprising a piezoelectric/electrostrictive film and a first electrode film and a second electrode film formed on at least one main surface of the piezoelectric/electrostrictive film; a piezoelectric/electrostrictive device wherein said piezoelectric/electrostrictive element is a piezoelectric/electrostrictive element having a structure in that a piezoelectric/electrostrictive element comprises a piezoelectric/electrostrictive film and a first electrode film and a second electrode film of comb-type structure, and the first electrode film and the second electrode film are alternatively biting with a gap of a predetermined width between respective teeth of each comb; a piezoelectric/electrostrictive device in which the movable portion, the thin plate portion, and the fixing portion are an integrally formed ceramics; a piezoelectric/electrostrictive device wherein said ceramics is a laminate of the ceramic; and a piezoelectric/electrostrictive device characterized in that at least one side in a direction connecting the fixing portion with the movable portion of a piezoelectric operating portion in the piezoelectric/electrostrictive element exist on the movable portion or the fixing portion, extending from bonding portion of the movable portion with a thin plate portion or a bonded portion of the fixing portion with a thin plate portion and over at least one half of the distance of the thickness d of the thin plate portion.

Furthermore, thirdly provided in the present invention is a method of fabricating a piezoelectric/electrostrictive device comprising a driving portion to be driven by a displacement of a piezoelectric/electrostrictive element, a movable portion to be operated based on a drive of the driving portion, and a fixing portion for holding the driving portion and the movable portion, said piezoelectric/electrostrictive device being provided in that the driving portion is formed of a pair of thin plate portions facing each other, and a film-like piezoelectric/electrostrictive element comprising and at least a pair of electrode films and a piezoelectric/electrostrictive film formed on at least a part of the outer surface of at least one thin plate portion of the thin plate portions, the fixing portion is coupled with the movable portion via the driving portion, a hole is defined by an inner wall of the driving portion, an inner wall of the movable portion, and an inner wall of the fixing portion, and at least one side in a direction connecting the fixing portion with the movable portion of a piezoelectric operating portion of the piezoelectric/electrostrictive element is structured to exist on the fixing portion or the movable portion;

said method of fabricating the piezoelectric/electrostrictive device being characterized by including steps of preparing a ceramic green laminate comprising at least one ceramic green sheet to become a thin plate, and at least one ceramic green sheet having at least one hole formed thereon, sintering the ceramic green laminate to produce a ceramic laminate, forming a piezoelectric/electrostrictive element by a film forming method on the outer surface of the thin plate of the ceramic laminate obtained, and cutting the ceramic laminate having the piezoelectric/electrostrictive element formed thereon.

Further provided are a method fabricating a piezoelectric/electrostrictive device wherein the steps of preparing a ceramic green laminate include a step of preparing ceramic green sheets become a pair of thin plates in such manner that they are laminated facing each other; a method fabricating a piezoelectric/electrostrictive device wherein the steps of preparing a ceramic green laminate include a step of preparing ceramic green sheets to become a pair of thin plates in such a manner that they are laminated on the outermost layers facing each other, respectively; a method of fabricating a piezoelectric/electrostrictive device wherein the steps of preparing a ceramic green laminate include a step of preparing a laminate by laminating a ceramic green sheet to become a thin plate with at least one ceramic green sheet having at least one hole formed thereon; a method of fabricating a piezoelectric/electrostrictive device wherein the steps of preparing a ceramic green laminate include a step of preparing a laminate by laminating a ceramic green sheet to become a thin plate with a desired number of the ceramic green sheets having each at least one hole formed thereon; and a method of fabricating a piezoelectric/electrostrictive device wherein the steps of preparing a ceramic green laminate include a step of preparing a laminate by laminating at least one ceramic green sheet having at least one hole formed thereon with ceramic green sheets to become a pair of thin plates in such a manner that ceramic green sheets to become a pair of thin plates are placed by facing each other on the outermost layer of the ceramic green laminate.

Further provided are a method of fabricating a piezoelectric/electrostrictive device wherein the steps of preparing a ceramic green laminate include steps preparing two laminates A by laminating a ceramic green sheet to become a thin plate laminated with at least one ceramic green sheet having at least one hole, respectively, preparing one green sheet having at least one hole formed thereon or a laminate B by laminating a plurality of ceramic green sheets having at least one hole formed thereon, and laminating laminates A by intervening said one ceramic green sheet having at least one hole formed thereon or the laminate B in a such manner that respective thin plate portions are placed at the outermost layer, respectively, when the laminate is prepared; a method of fabricating a piezoelectric/electrostrictive device characterized in that a protrusion is provided on a portion on an outside surface of a layer of at least one side of the outermost layer of the ceramic green laminate excluding at least the thin plate portion; a method fabricating of a piezoelectric/electrostrictive device wherein said method of fabricating a piezoelectric/electrostrictive device includes steps of laminating, on a outermost layer of a laminate comprising ceramic green sheets having at least one hole formed thereon, respectively, a ceramic green sheet having at least one hole formed thereon which is mounted on a plastic film in such a manner that said plastic film becomes a new outer layer when at least a plurality of ceramic green sheets having at least one hole formed thereon, respectively is laminated, and then removing the plastic film after holes are accurately aligned; a method of fabricating a piezoelectric/electrostrictive device, wherein said method of fabricating a piezoelectric/electrostrictive device includes steps of laminating a ceramic green sheet having at least one hole formed thereon which is mounted on a plastic film on a ceramic green sheet to become the thin plate in such manner that the plastic film is placed as an outer layer, and removing the plastic film after holes are accurately aligned; a method of fabricating a piezoelectric/electrostrictive device where the plastic film is a poly(ethyleneterephthalate) film; a method of fabricating a piezoelectric/electrostrictive device, wherein a ceramic laminate with a piezoelectric/electrostrictive element formed on the outer surface of the thin plate portion is further cut into a plurality of desired units, and then the cut units are heat treated at 300° C. to 800° C.; and a method of fabricating a piezoelectric/electrostrictive device, characterized in that when a ceramic laminate with the piezoelectric/electrostrictive element formed thereon is cut, the piezoelectric/electrostrictive element and the laminate is simultaneously cut so as to make the width of the piezoelectric/electrostrictive element the same as the width of thin plate portion of the laminate.

It is preferable that a piezoelectric/electrostrictive device according to the present invention comprises, as aforementioned, a movable portion, a thin plate portion, and a fixing portion in an integrally formed ceramic, and it is more preferable that the moving portion, the thin plate portion, and the fixing portion are composed of a material with fully-stabilized zirconia as a major component or a material with partially-stabilized zirconia as a major component, and it is specifically preferable that at least a movable portion, a thin plate portion, and a fixing portion are a sintered ceramic green laminate. This is because the bonded portion between a movable portion, a thin plate portion, and a fixing portion can be made a borderless structure by sintering integration, thus long term reliability with lapse of time can be improved, and additionally a high displacement can be showed with a good reproducibility by suppressing a phenomenon such as drifting or the like, as a displacement as a device with lapse of time, to extremely small levels.

It should be noted that, when fabricating a device of a structure according to the present invention, in addition to all parts integrally sintered, a laminate divided in a mutually opposing direction of thin plate portions, namely a ceramic laminate composed of one thin plate portion and members constituting in the future a fixing portion and a movable portion in rectangular solid forms is prepared, a piezoelectric/electrostrictive element is formed by the screen printing so that the element overlaps a thin plate portion and a movable portion and/or a fixing portion of the ceramic laminate, and at least two sintered structures each formed by integrally sintering with the ceramic laminates are prepared, and by bonding the sintered structures so that the thin plate portions are separated away from each other, namely by bonding each of the above-described portions to be the fixing portion and the movable portion in the future so as to combine by using an adhesive or the like, thus a device can also be obtained. However, since a device fabricated by integrally sintering all members does not have, in a structure, a discontinuous portion like a bonded portion where a third member intervenes, the device is superior in stability and reliability even if a stress is applied to the device by operation of the driving portion, thus it is desirous to form a device by a method of integrally sintering all members as described above without using an adhesive or the like.

Further, it is preferable that, in a piezoelectric/electrostrictive device according to the present invention, a piezoelectric/electrostrictive film constituting a piezoelectric/electrostrictive element is composed of a material including lead zirconate, lead titanate, and lead magnesium niobate as a major component, and a material composed of sodium bismuth titanate as a major component is also preferable. As will be appreciated, details of materials to be used are hereinafter described.

Furthermore, according to the present invention, an optical shutter is provided. The optical shutter is for controlling transmission and shielding of light by relatively moving two shields, and at least one of the shields is mounted on a movable portion of the above-described piezoelectric/electrostrictive device.

BRIEF DESCRIPTION OF THE DRAWINGS

FIG. 10 shows a schematic perspective view of still another embodiment of a

FIG. 22 shows side views of an embodiment of a fabricating method of a piezoelectric/electrostrictive device of the present invention.

FIG. 24 shows perspective views of another embodiment of a fabricating method of a piezoelectric/electrostrictive device of the present invention.

FIG. 25 shows schematic explanatory views of an embodiment of an optical shutter of the present invention.

FIG. 26 shows schematic explanatory views of another embodiment of an optical shutter of the present invention.

FIG. 28 shows a schematic view of an example of a fabricating method of a piezoelectric/electrostrictive device of the present invention.

FIG. 32 shows schematic views of examples of respective ceramic green sheet to be used in a laminate of green sheets in a fabricating method of a piezoelectric/electrostrictive device of the present invention.

DESCRIPTION OF PREFERRED EMBODIMENTS

Figure 1:
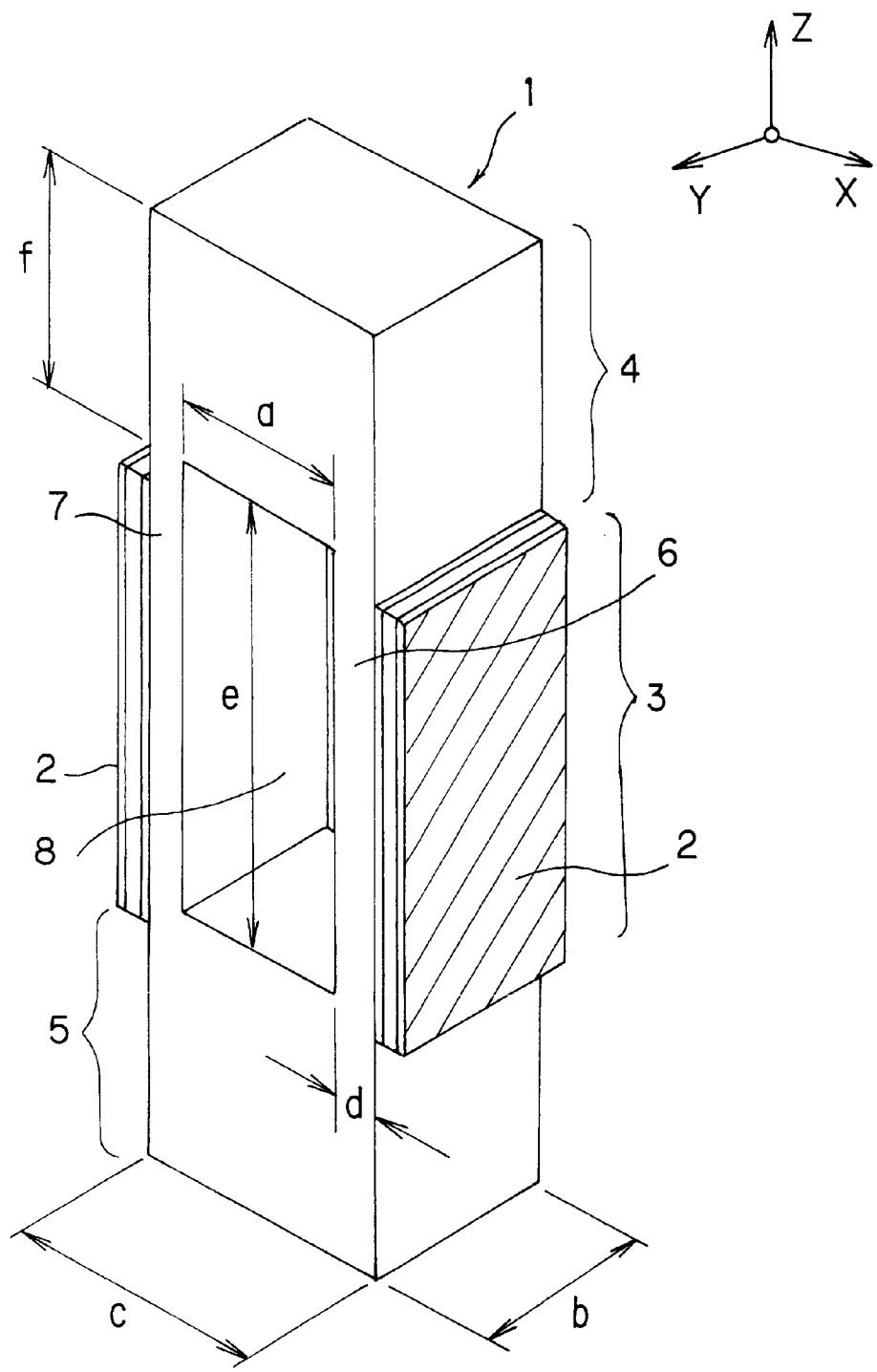
FIG. 1 shows a schematic perspective view of an embodiment of a piezoelectric/electrostrictive device of the present invention.

A piezoelectric/electrostrictive device of the present invention is hereinafter described with reference to drawings. However, the present invention is not restricted to embodiments shown in the drawings.

It should be noted that, in the descriptions to be made hereinafter, "piezoelectric" may mean "piezoelectric and/or electrostrictive". Further, a piezoelectric/electrostrictive element in the present application denotes an element including at least a pair of electrode films and a piezoelectric/electrostrictive film, and an element with only an electrode film or only a piezoelectric/electrostrictive film, or a portion only with an electrode and a piezoelectric/electrostrictive film may also exist. Further, a piezoelectric operating portion, or a piezoelectric/electrostrictive portion is meant, if a description is made for an example in a case with a displacement element, in a piezoelectric/electrostrictive element of the present application, by a portion where a strain is caused and a displacement is developed when a voltage is applied from outside, namely by a portion substantially comprising a pair of electrodes and a piezoelectric/electrostrictive film. Further, "length" means a distance in a direction connecting a movable portion with a fixing portion, namely in the Z-axis direction in the drawings, "width" means a distance in a direction penetrating through a hole, namely in the Y-axis direction in the drawings, and "thickness" means a distance in the laminating direction of a piezoelectric element and a thin plate, namely in the X-axis direction in the drawings. It should be noted that, in the drawings, those having the same or the similar function are denoted, in principle, by the same symbols.

1. Embodiments of Device

"A piezoelectric/electrostrictive device (hereinafter simply referred to as "device") is a notion covering an element for converting electric energy into mechanical energy, and vice versa, by way of a piezoelectric/electrostrictive material. Accordingly, whereas the element is preferably used as an active element of a variety of actuators, vibrators, or the like, and more particularly as a displacement element utilizing a displacement due to an inverse piezoelectric effect or an electrostrictive effect, the element can also be used as a passive element of an acceleration sensor element, a impact sensor element, or the like.

FIG. 1 shows a schematic perspective view of an embodiment of a device 1 according to a first aspect of the present invention. The device 1 comprises a driving portion 3 which is driven by a displacement of a piezoelectric element 2, a movable portion 4 which is displaced based on a drive of the driving portion 3, and a fixing portion 5 which holds the driving portion 3 and the movable portion 4. The driving portion 3 comprises a pair of thin plate portions 6, 7 facing each other, and a film-like piezoelectric/electrostrictive element 2 formed on the outer surface of at least one thin plate portion of the thin plate portions, the fixing portion 5 is coupled with the movable portion 4 via the driving portion 3, a part of a piezoelectric operating portion exists on the fixing portion, and a hole is defined by an inner wall of the driving portion 3, an inner wall of the movable portion 4, and an inner wall of the fixing portion 5. In a structure where a piezoelectric operating portion according to the present invention is overlapping the fixing portion or the movable portion, it is characterized in that a displacement shape of the driving portion is in a shape such that the thin plate portion bends toward the outside space, thus the movable portion can be largely displaced. Here, in order to ensure the displacement shape, it is preferable that a distance of the piezoelectric/electrostrictive operating portion overlapping the fixing portion or the movable portion is more than one half of the thickness d of the thin plate portion.

The device 1 is so structured that a ratio a/b of the thickness of the hole, namely a distance a in the X-axis direction in FIG. 1, and the width of the thin plate portion, namely a distance b in the Y-axis direction in FIG. 1 is 0.5 to 20. The ratio a/b is preferable 1 to 10, and more preferably 2 to 5. The defined value of a/b is based on a finding that a displacement of a piezoelectric/electrostrictive device according to the present invention is made larger, and a displacement in the X-Z plane in FIG. 1 can be dominantly obtained. On the other hand, a ratio e/a of the length of the thin plate portion, namely a distance e in the Z-axis direction in FIG. 1, and the thickness a of the hole a is preferably 0.5 to 10, and more preferably 0.7 to 5. The defined value of e/a is based on a finding that a piezoelectric/electrostrictive device according to the present invention can generate a high displacement at a high resonant frequency, namely at a high responsive speed. Consequently, in order to make the present device to be a structure where a swung or flapped displacement or vibration in the Y-axis direction is suppressed, and the device is superior in high speed responsibility and also has a larger displacement at a relatively low voltage, it is specifically preferable to have the ratio a/b at 0.5 to 20 and the ratio e/a at 0.5 to 10, and remarkably preferable to have the ratio a/b at 1 to 10, and the ratio e/a at 0.7 to 5. By the way, the hole 8 may be filled with a gel material, for example, a silicone gel.

The length f of the movable portion 4 shown in FIG. 1 is preferably shorter. With a shorter length, the movable portion 4 can be made lighter in weight and a resonant frequency can be higher. However, in order to secure stiffness of the movable portion 4 in the X-axis direction, and to ensure a displacement thereof, a ratio f/d relative to the thickness d of the above-mentioned thin plate is to be 3 or more, and preferably 10 or more. It should be noted that actual dimensions of each components are determined by paying due consideration to a bonding area for attaching components to the movable portion 4, a bonding area for attaching the fixing portion 5 to another member, a bonding area for attaching electrode terminals or the like, mechanical strength and durability of the device as a whole, a required displacement and a resonant frequency, a driving voltage, and the like. Ordinarily, the value of a is preferably 100 μm to 2000 μm, and more preferably 200 μm to 1000 μm. Ordinarily, the value of b is preferably 50 μm to 2000 μm, and more preferably 100 μm to 500 μm. Ordinarily, in order that a flapped displacement, or a displacement component in the Y-axis direction can be effectively suppressed, the value of d is b>d relative to the thickness b of the hole portion, and preferably 2 μm to 100 μm, and more preferably 4 μm to 50 μm. Ordinarily, the value of e is referably 200 μm to 3000 μm, and more preferably 500 μm to 2000 μm. And ordinarily, the value of f is preferably 50 μm to 2000 μm, and ore preferably 100 μm to 1000 μm. It should be noted that, by structuring the device in this way, the displacement in the Y-axis direction relative to the displacement in the X-axis, the main axis, direction does not ordinarily exceed 10%, however, by suitably adjusting within a range of the preferable dimension ratios and the actual dimensions, driving at a lower voltage is possible, and the displacement component in the Y-axis direction can be adjusted to 5% or less, which is a remarkably superior advantage. In other words, a substantially dominant displacement is obtained for one axis of the X-axis, which is the main axis. Thus, a device, which is superior in high speed responsibility and develops a larger displacement at a relatively low voltage, can be obtained.

Figure 3:
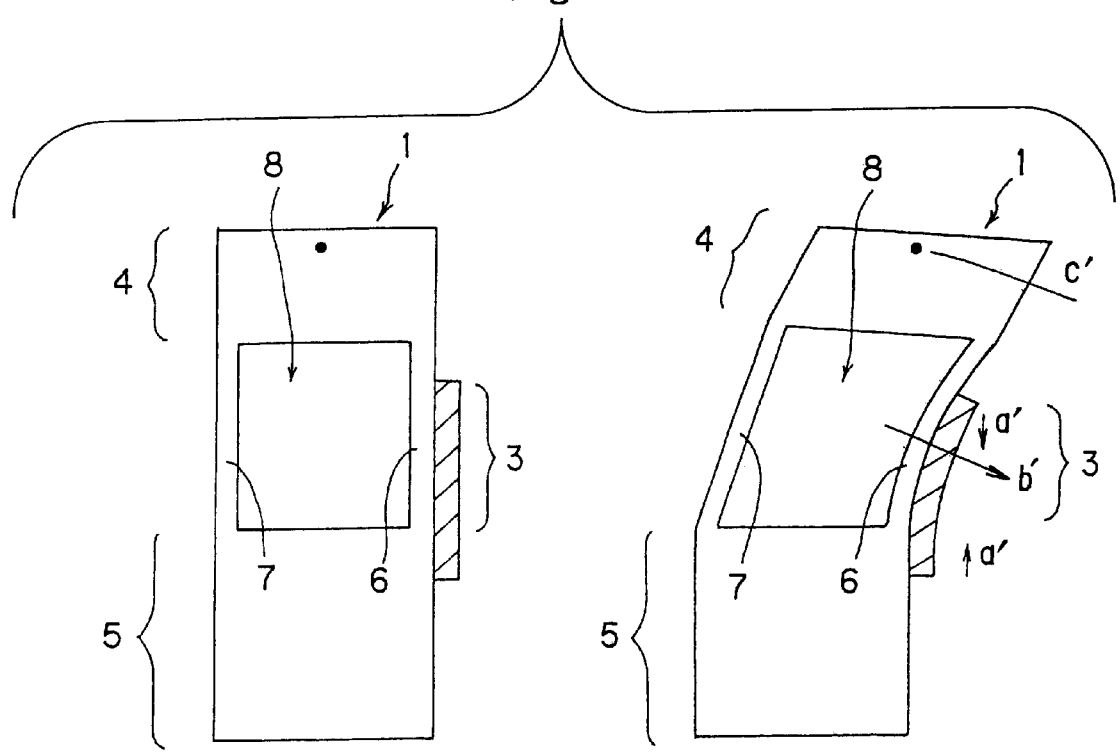
FIG. 3 shows a schematic explanatory view of an operational mode of a piezoelectfic/electrostrictive device of the present invention.

By the way, the driving direction of the driving portion 3 is schematically shown in FIG. 3. In FIG. 3, a case is shown where the device 1 has the piezoelectric element 2 form ed on a surface of one of a pair of the thin plate portions 6 and extended over to the fixing portion, and in this case, the driving portion drives in a direction orthogonally crossing the displacement direction of the piezoelectric element which is shown by a symbol a in FIG. 3, namely in a direction shown by a symbol b'. In other words, since an infinitesimal displacement in expansion-contraction direction of the piezoelectric element 2 is first amplified into a larger drive utilizing bending of the thin plate portion 6, and then transmitted to the movable portion 4, the movable portion 4 can be operated in a large magnitude as shown by a symbol c'.

Figure 2:
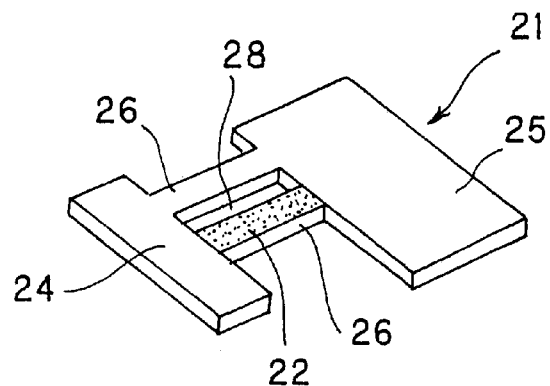
FIG. 2 shows a schematic perspective view of an embodiment of a conventional piezoelectric actuator.

It should be noted that, in the device 1, since the shape of the device is not a board-like body as shown in FIG. 2, while the movable portion 4 and the fixing portion 5 are in a rectangular solid form, and the thin plate portions 6 and 7 are provided so that the side faces of the movable portion 4 and the fixing portion 5 are continuous, stiffness of the device in the Y-axis direction can be selectively raised. In other words, in the device 1, only an operation of the movable portion 4 within a plane including the driving direction of the driving portion 3, namely within the XZ plane, can be selectively generated, and an operation within the YZ plane of the movable portion 4, or an operation in the so-called flapped direction can be suppressed.

Figure 4:
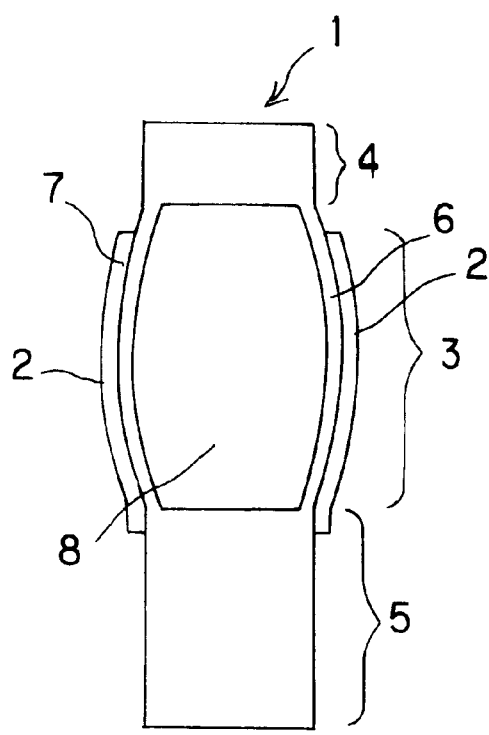
FIG. 4 shows a schematic explanatory view of another embodiment of a piezoelectric/electrostrictive device of the present invention.
Figure 5:
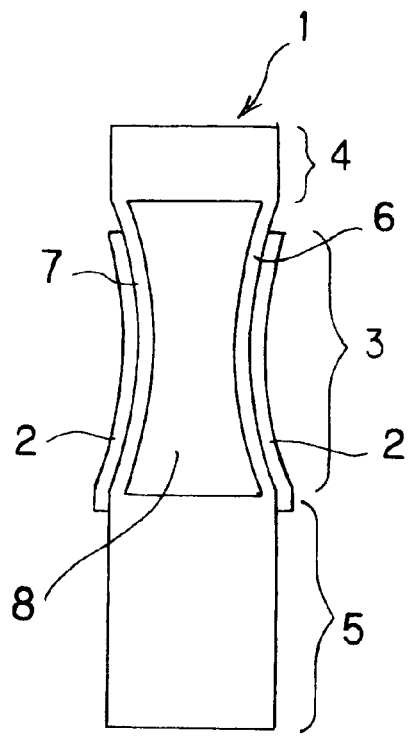
FIG. 5 shows a schematic explanatory view of still another embodiment of a piezoelectric/electrostrictive device of the present invention.

The shape of a hole 8 defined by an inner wall of the driving portion 3, an inner wall of the movable portion 4, and an inner wall of the fixing portion 5 can be optional as long as the operation of the driving portion is not hampered. For example, the shape may be that the central portion has curvatures formed toward outward both in the left and the right as shown in FIG. 4, or the central portion has curvatures formed toward inward both in the left and the right as shown in FIG. 5. In both shapes, the device is bent in the displacement direction, thus a desired displacement can be obtained at a relatively low voltage.

Figure 6:
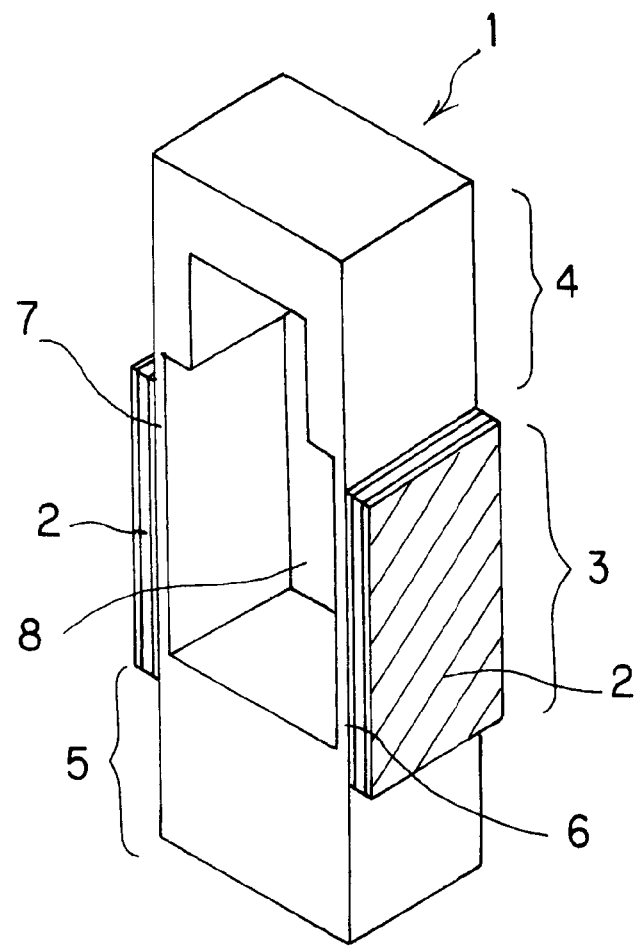
FIG. 6 shows a schematic perspective view of still another embodiment of a piezoelectric/electrostrictive device of the present invention.
Figure 7:
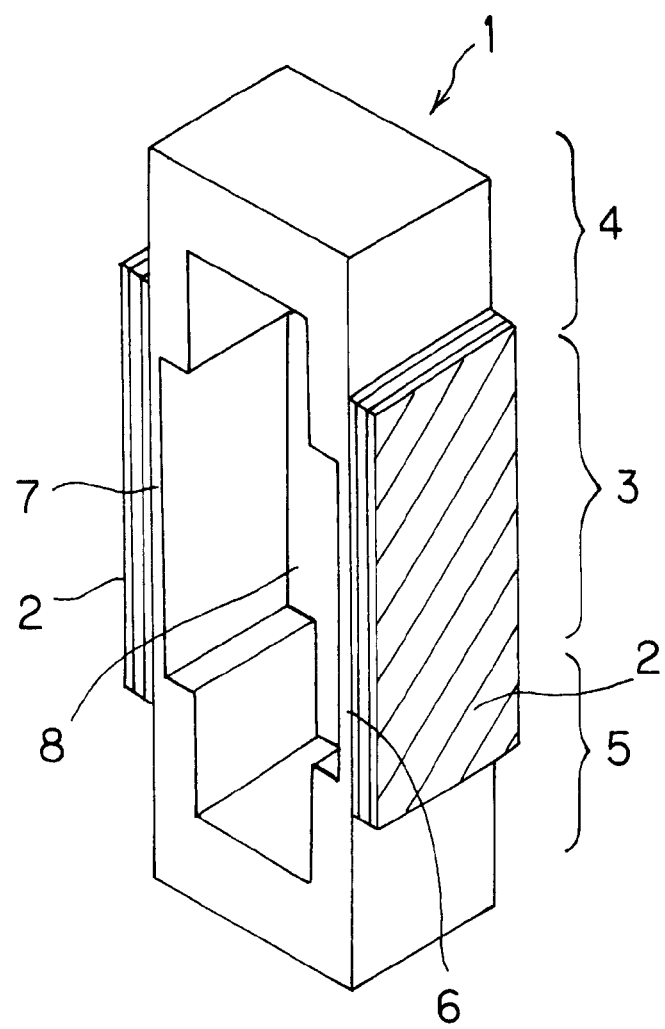
FIG. 7 shows a schematic perspective view of still another embodiment of a piezoelectric/electrostrictive device of the present invention.

The hole 8 may be formed with a part thereof encroaching into a part of the movable portion 4, as shown in FIG. 6, or may be formed with a part thereof encroaching into a part of the fixing portion 5 as well as into the movable portion 4, as shown in FIG. 7. Parts of the hole 8 formed in the movable portion 4 and the fixing portion 5 are not necessarily to be mutually similar or the same, and the shapes may be determined depending on a mode of application or the like of the device. Of course, the shape of the hole to be formed inside the movable portion 4 and/or the fixing portion 5 is not required to be a rectangular solid or a cubic form, and can be optionally selected from known shapes depending on a mode of application or the like thereof. In any of the above-mentioned cases, the volume of the movable portion 4 and/or the fixing portion 5 can be reduced. Consequently, an advantage can be represented that the device is naturally made lighter in weight, and particularly in the movable portion 4, the reduced weight favorably acts to increase a resonant frequency. Further, since a joined portion of the thin plate portion with the movable portion or the fixing portion has a stepped structure, a stress centered at the joining portion can be effectively relieved, in comparison with an embodiment not having such stepped structure, thus improving long-term reliability.

Figure 8:
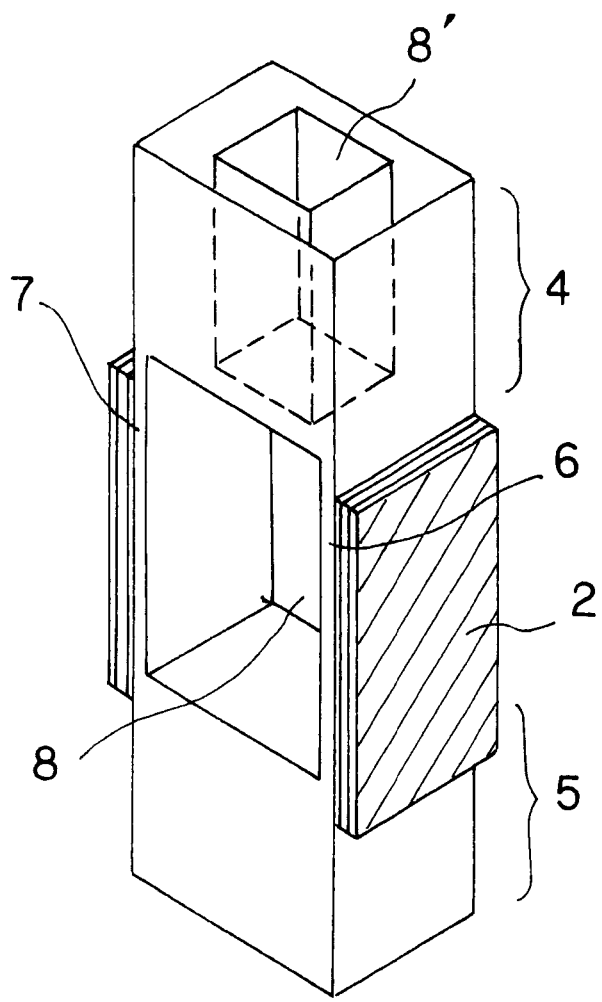
FIG. 8 shows a schematic perspective view of still another embodiment of the piezoelectric/electrostrictive device of the present invention.

As shown in FIG. 8, a through-hole 8' may be formed in a part of the movable portion 4 in a form communicated with the hole 8. Though not shown, the through-hole 8' may be formed in a part of the fixing portion 5, in a form corresponded to FIG. 7, in the similar way as in the movable portion 4 in a form communicated with the hole 8. Of course, the through-hole 8' may be formed in a part of the fixing portion 5, instead of the movable portion 4, in a form communicated with the hole 8, though not shown. The through-holes 8' formed in the movable portion 4 and the fixing portion 5 are not required to be mutually similar or the same in shape, and the shape may be determined depending on a mode of application or the like of the device. Of course, the through-hole 8' formed in the movable portion 4 and/or the fixing portion 5 is not required to be in a rectangular solid or a cubic form, and it goes without saying that the shape thereof can be optionally selected from known shapes depending on a mode of application or the like thereof.

Now description is made about a piezoelectric/electrostrictive device comprising a driving portion to be driven by a displacement of a piezoelectric/electrostrictive element, a movable portion to be operated based on a drive of the driving portion, and a fixing portion for holding the driving portion and the movable portion, wherein the driving portion is formed of a pair of thin plate portions facing each other and a film-like piezoelectric/electrostrictive operating portion formed on at least a part of the outer surface of at least one thin plate portion of the thin plate portions and having a length which exceeds the length of the thin plate portion constituting the driving portion, and reaches to at least a part of the movable portion, and/or having a width which a width same as the width of the thin plate portion the fixing portion is coupled with the movable portion via the driving portion, and a hole is defined by an inner wall of the driving portion, an inner wall of the movable portion, and an inner wall of the fixing portion.

Figure 9:
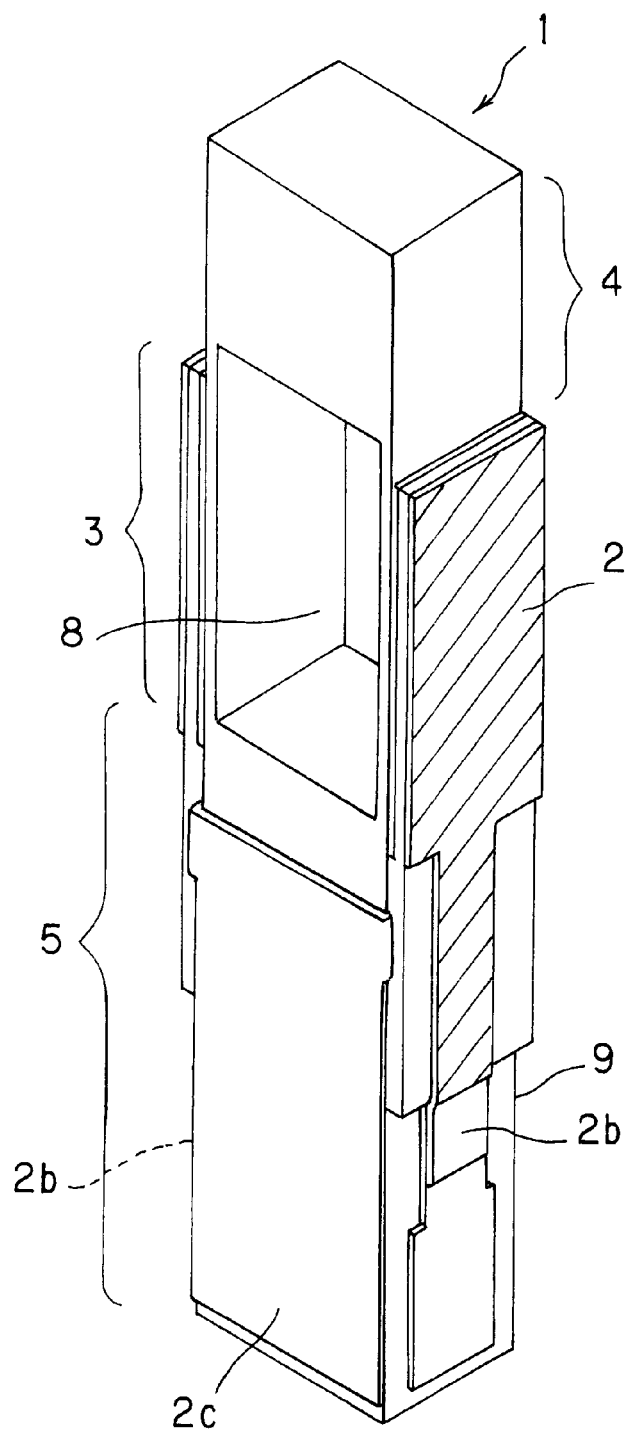
FIG. 9 shows a schematic perspective view of still another embodiment of a piezoelectric/electrostrictive device of the present invention.
Figure 10:
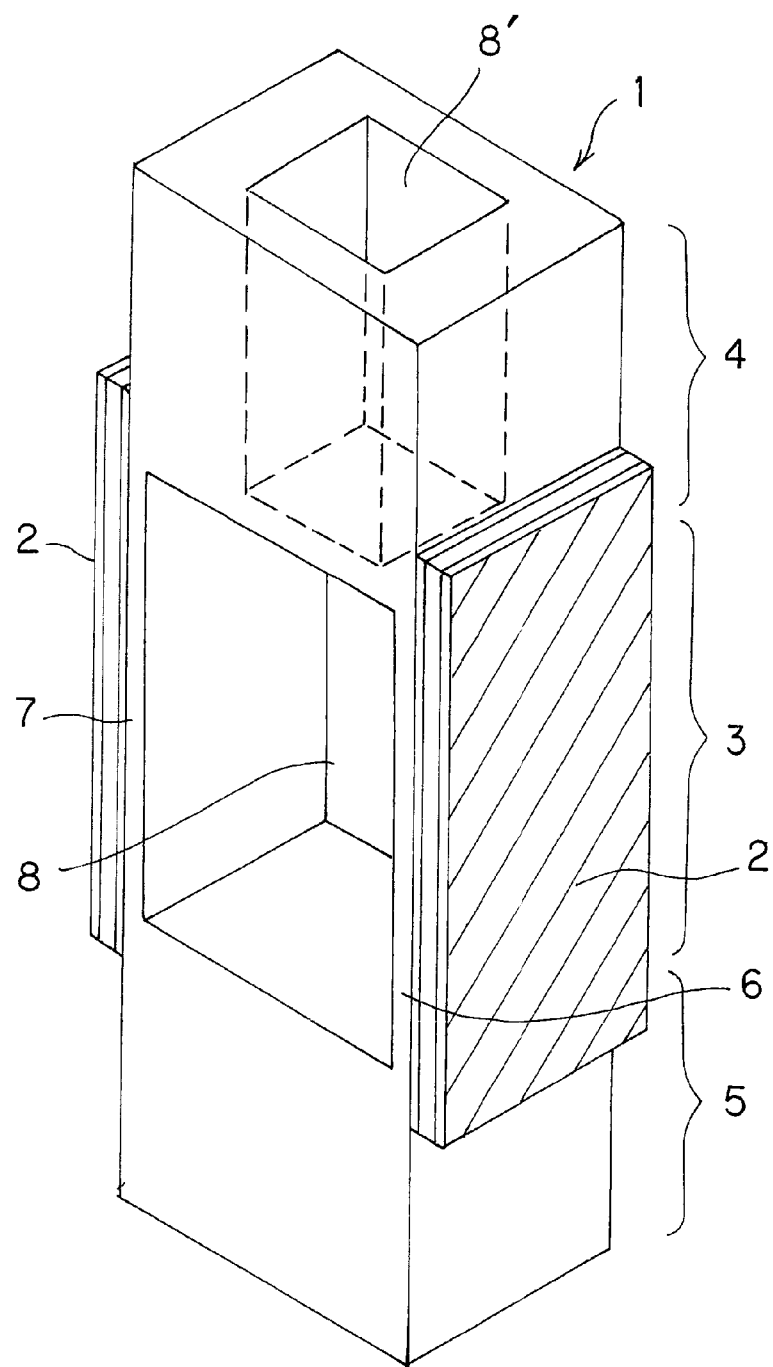

To begin with, description is made about an embodiment where a piezoelectric/electrostrictive element formed on at least a part of the outer surface of at least one thin plate portion of the thin plate portions having a width same as the width of the thin plate portion, as shown in FIG. 9, is used. When the width of the piezoelectric/electrostrictive element is same as the width of the thin plate portion, as shown in FIG. 9 and FIG. 10, a generating force of the driving portion is increased, thus favorably acting on a higher displacement. In this case, a device may be implemented with piezoelectric elements 2 formed respectively on both of the pair of the thin plate portions, with a lower electrodes 2c of the two piezoelectric elements 2 being made to be commonly used, and is drawn out from the side of the fixing portion 5 on one surface where the hole 8 is apertured, and with an upper electrode 2b which is directly drawn out on the side of the fixing portion 5 of the surface where the piezoelectric elements 2 are formed. In this embodiment, since a part of the side of the fixing portion 5 on the other surface where the hole 8 is apertured, namely at numeral 9 in FIG. 9, has no electrode formed thereon, and the part can be utilize d for securing the device, the device can be reliably secured, favorably serving for compaction or the like, which is an advantage. Further, as to be described hereinafter, the surface of the electrode 2c may be made as a fixing surface, and bonding and securing with circuits or the like may be simultaneously performed. Furthermore, FIG. 10 shows an embodiment of a through-hole 8' formed in a part of the movable portion 4, as shown in above-described FIG. 8, in a form communicated with the hole 8, where the length of the piezoelectric/electrostrictive element is extended to a part of the movable portion 4 using an element which is longer in Z-axis direction. In this embodiment, an advantage by the formation of the throughs-hole 8' and another advantage by the elongation in Z-axis direction of the length of the piezoelectric/electrostrictive element are demonstrated, which is preferable. Of course, the similar structure may be utilized in embodiments shown in FIG. 1, and FIGS. 3 to 8. In FIG. 9, however, although an element is formed to the vicinity of the movable portion 4, from an displacement mechanism standpoint of the device according to the present structure, it is preferable to form an element at a position over a length of 65% to 85% of the length of the thin plate portion , which can produce a large displacement.

Figure 11:
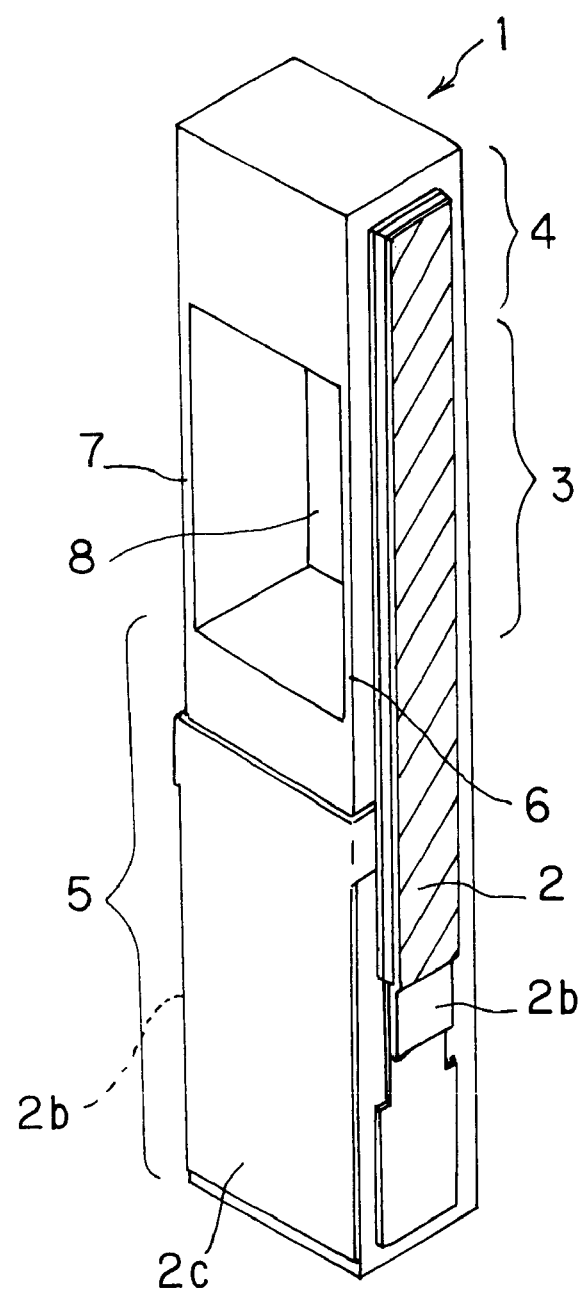
FIG. 11 shows a schematic perspective view of still another embodiment of a piezoelectric/electrostrictive device of the present invention.
Figure 29:
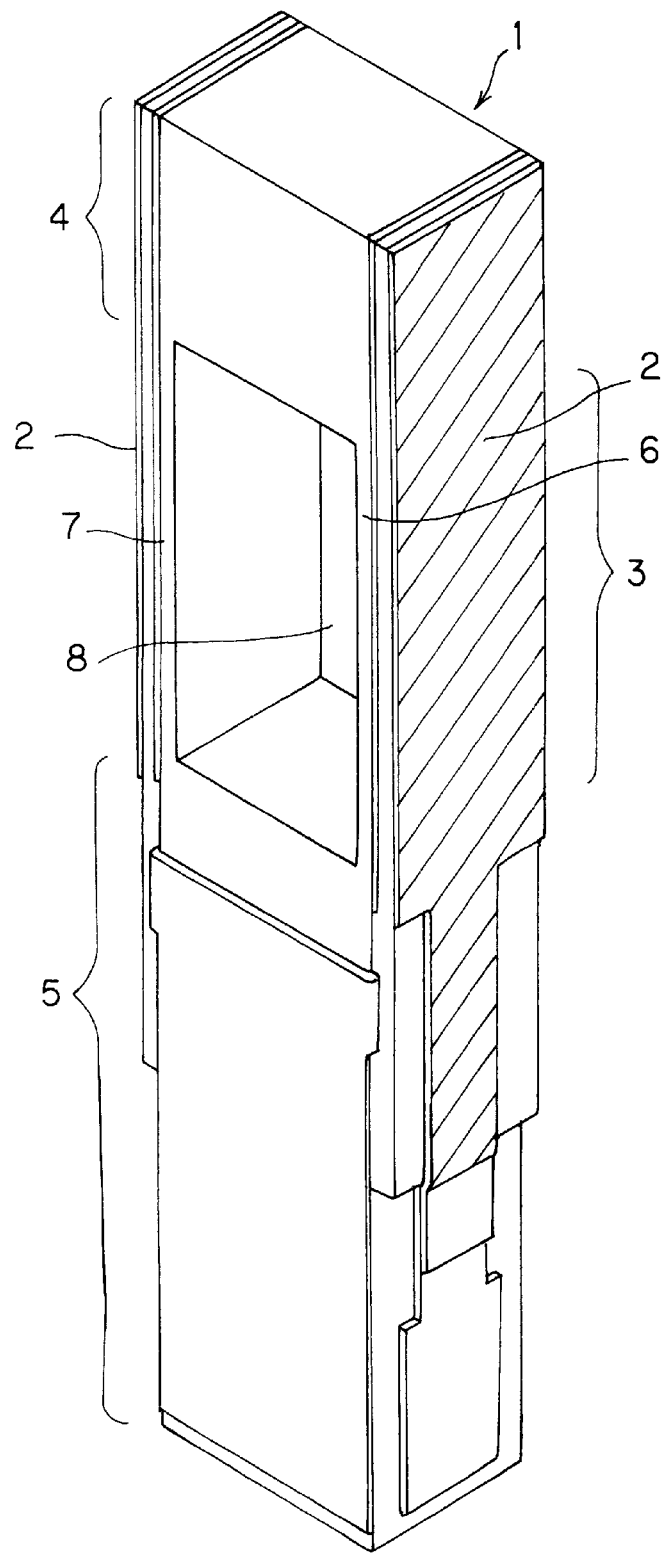
FIG. 29 shows a schematic explanatory view of still another embodiment of a piezoelectric/electrostrictive device of the present invention.

Now, description is ma de about an embodiment where a piezoelectric/electrostrictive operating portion has a length which exceeds the length of the thin plate portion constituting the driving portion and reaches to at least a part of the movable portion, as shown in FIG. 11 and FIG. 29. When using this structure, the mechanical strength of the joining portion between the movable portion and the thin plate portion can be reinforced and a resonant frequency can be also raised. Further, FIG. 29 shows a case, similarly with FIG. 9, where the width of a piezoelectric element is made in the same width as the width of the thin plate portion, and an end surface thereof shares the end surface of the movable portion. According to this structure, a largely generated displacement and generating force based on the effect of the width of a piezoelectric element is added to the effect of the structure shown in FIG. 11. Further, there is a characteristic that variation of features among opposing piezoelectric elements is small, since a shape of the piezoelectric element is determined together with the fixing portion by mechanical machining or the like to be described hereinafter. Although, in FIGS. 11 and 29, lengths of a lower electrode, a piezoelectric film, and an upper electrode in a piezoelectric element are the same, the lengths are not necessarily to be the same, and from the displacement mechanism standpoint of the device according to the present structure, it is preferable that at least the upper electrode is made shorter than the piezoelectric film and the lower electrode to be around 50% of the length of a thin plate portion (hole part length). It is preferable to have this sort of electrode structure, since a large displacement can be obtained while securing the mechanical strength of the joined portion of the thin plate portion with the movable portion.

Figure 30:
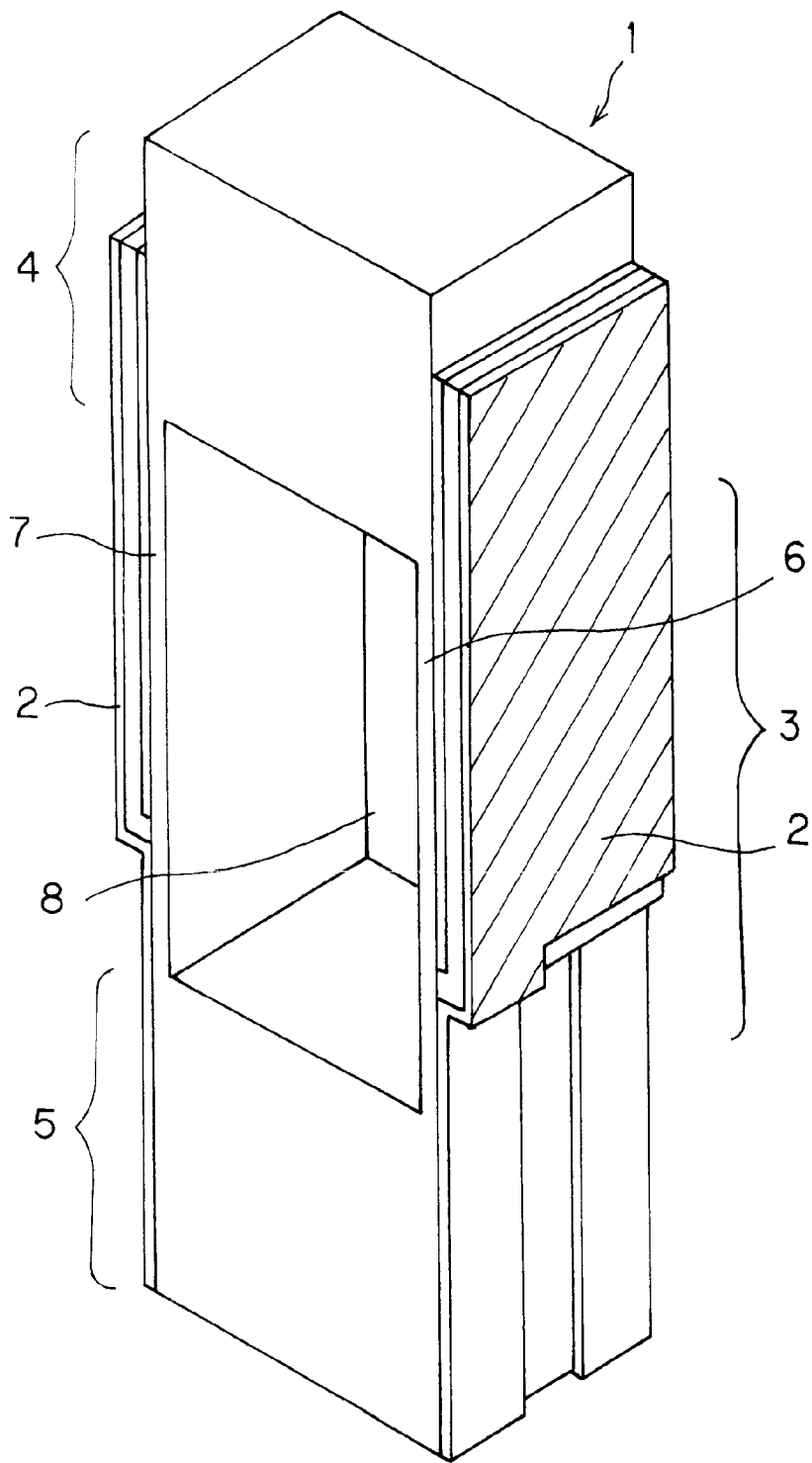
FIG. 30 shows a schematic explanatory view of still another embodiment of a piezoelectric/electrostrictive device of the present invention.
Figure 31:
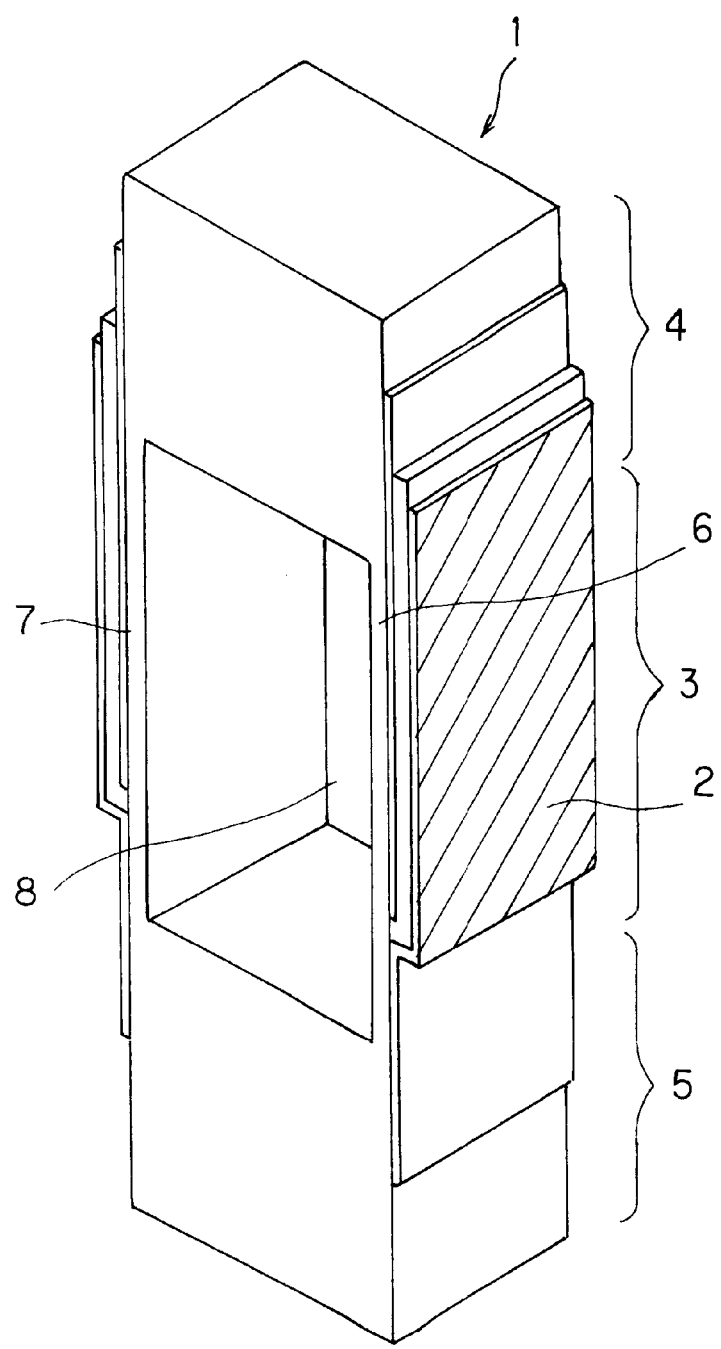
FIG. 31 shows a schematic explanatory view of still another embodiment of a piezoelectric/electrostrictive device of the present invention.

In embodiments shown in FIG. 30 and FIG. 31, different from the embodiment in above-described FIG. 9, an element is formed in the thin plate portion to the vicinity of the fixing portion 5. In other words, while the element is formed as a piezoelectric operating portion in a mode extending over the thin plate portion and the fixing portion in FIG. 9, in FIG. 30 and FIG. 31, the piezoelectric operating portion is contrarily formed in a mode extending over the thin plate portion and the movable portion. Also in FIG. 30 and FIG. 31, in the same way as in FIG. 9, the width of a piezoelectric/electrostrictive element is the same as the width of the thin plate portion, and therefore, an advantage same as the case with FIG. 9 is obtainable, and the movable portion per se can be displaced basically in the same way as is the case in FIG. 9. It should be noted that FIG. 30 is an embodiment in which a terminal is formed on the fixing portion on the same surface as the surface where an element is formed, while FIG. 31 is an embodiment in which a terminal is formed in the fixing portion and the movable portion on the same surface as the surface where an element is formed, and an element with a terminal provided at a specific position may be selected for use depending on a mode of respective device packaging.

Figure 12:
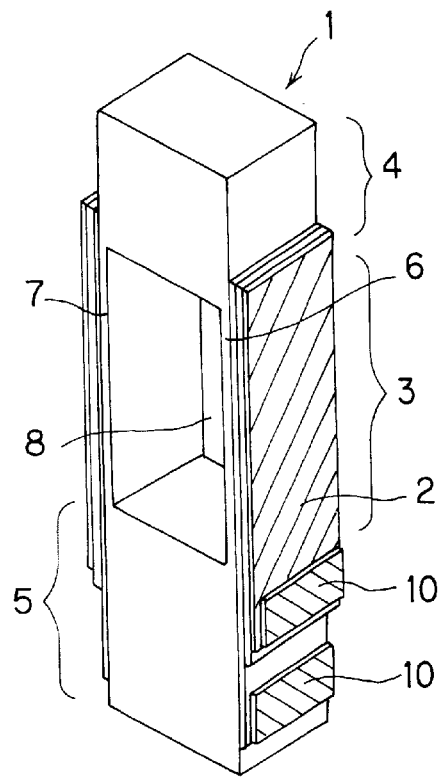
FIG. 12 shows a schematic perspective view of still another embodiment of a piezoelectric/electrostrictive device of the present invention.
Figure 13:
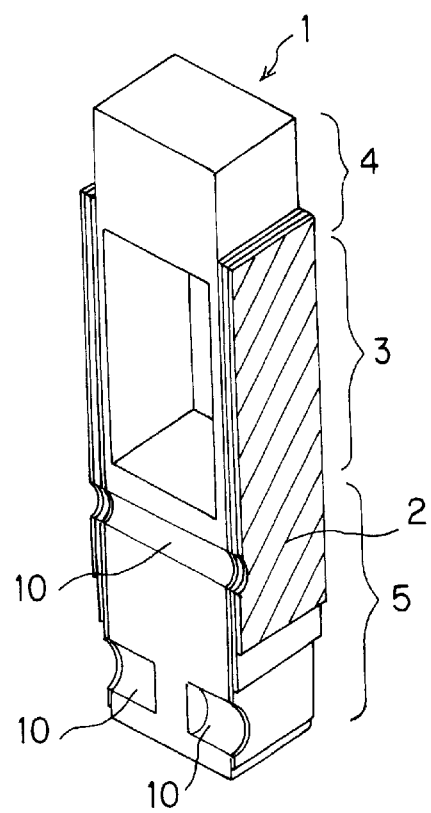
FIG. 13 shows a schematic perspective view of still another embodiment of a piezoelectric/electrostrictive device of the present invention.

Now, arrangement of a driving signal applying terminal 10 shown in FIG. 12 and FIG. 13 is described. FIG. 12 shows an embodiment in which the driving signal applying terminals 10 are arranged on the side face of the fixing portion 5, namely on the same surface as the surface where a piezoelectric/electrostrictive element is formed. According to this structure, the device can be secured independently of the surface where the terminals are arranged, thus high reliability can be obtained in securing the device and bonding of circuits with terminals. In this embodiment, the terminals and the circuits are bonded by means of the flexible printed circuit (also called FPC), the flexible flat cable (also called FCC), the wire bonding or the like. FIG. 13 shows the driving signal applying terminals 10 arranged on a surface orthogonally crossing the surface having a piezoelectric/electrostrictive element arranged thereon. If the surface with the driving signal applying terminals formed thereon is utilized as a fixing surface, there is an advantage that the connection of the driving signal applying terminals 10 with the circuits (not shown) and the securing of the device per se can be simultaneously performed. In this embodiment, a throughhole is previously provided in the fixing portion 5, the through-hole is filled with a conductive material, and a piezoelectric/electrostrictive element pattern is formed so that respective electrodes and the through-hole are respectively joined, then the filled surface of the through-hole is exposed by machining, and the surface is thus utilized as the driving signal applying terminal 10. As a conductive material, a conductor wire may be embedded. It should be noted that the through-hole provided in the vicinity of the hole 8 is used as a common terminal in this embodiment.

Figure 14:
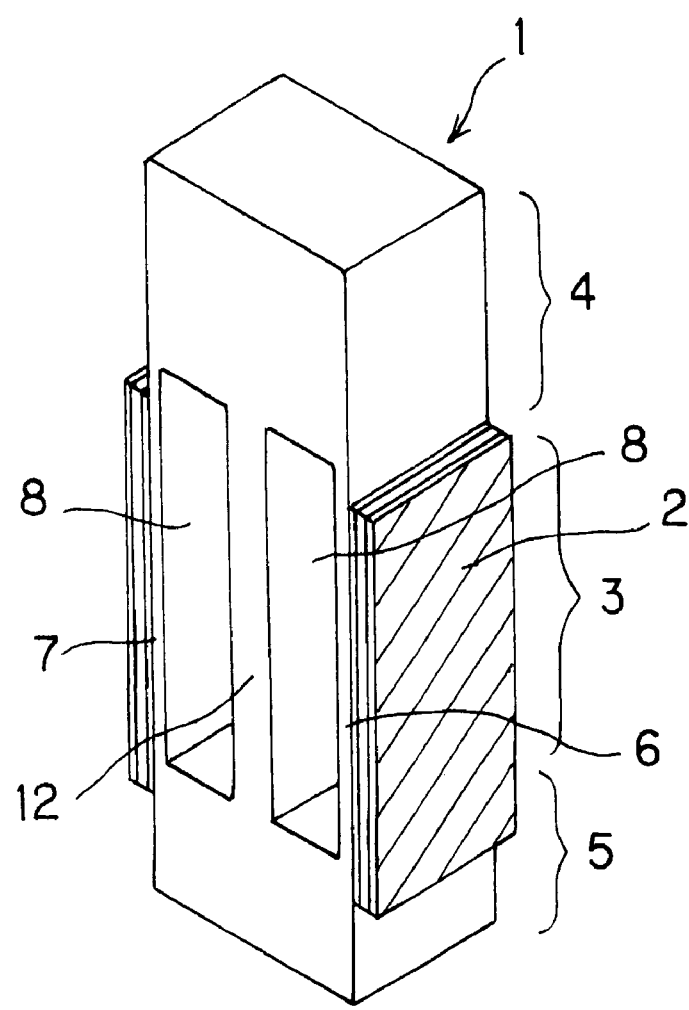
FIG. 14 shows a schematic perspective view of still another embodiment of a piezoelectric/electrostrictive device of the present invention.
Figure 15:
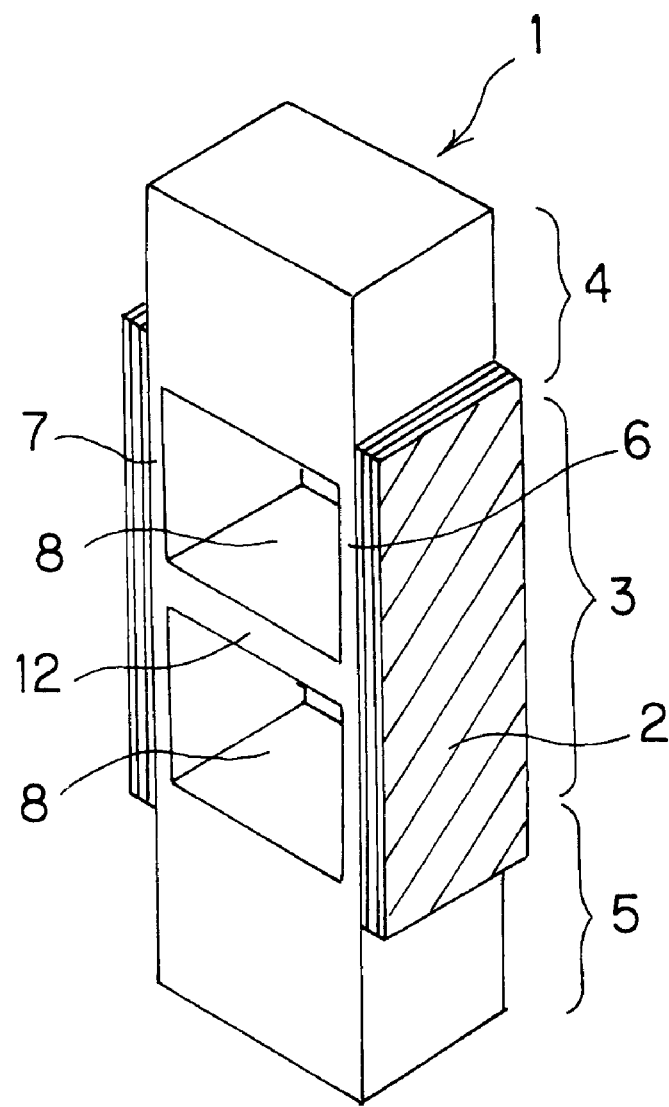
FIG. 15 shows a schematic perspective view of still another embodiment of a piezoelectric/electrostrictive device of the present invention.
Figure 16:
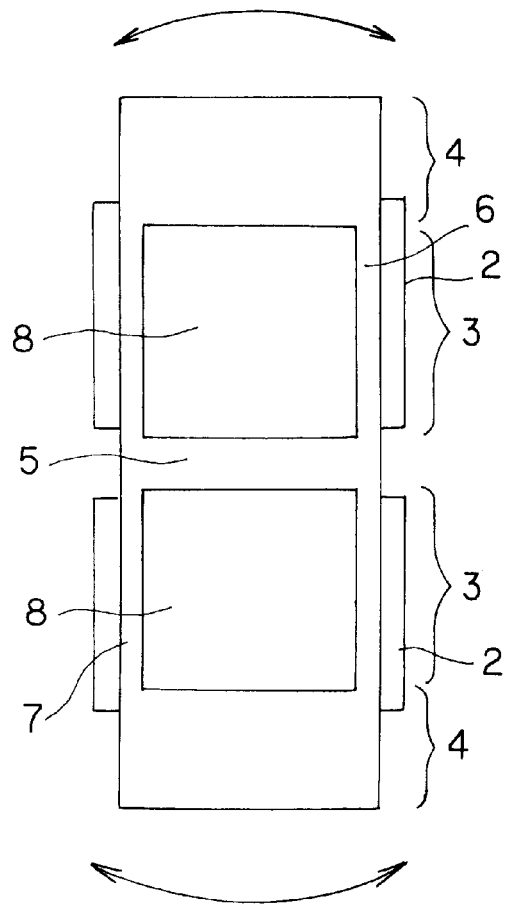
FIG. 16 shows a schematic explanatory view of still another embodiment of a piezoelectric/electrostrictive device of the present invention.

Now, an embodiment with a beam formed in the hole 8 is described. FIG. 14 shows an embodiment of a beam 12 formed in parallel with the Z-axis direction, and FIG. 15 shows an embodiment of a beam 12 formed perpendicularly in the Z-axis direction. In the embodiment shown in FIG. 14, stiffness of the device can be raised without substantially reducing a displacement, with a resultantly raised resonant frequency, which is an advantage. In an embodiment shown in FIG. 15, stiffness of the device can be raised, and as the result, an advantage can be realized that a resonant frequency is raised. FIG. 16 shows an embodiment of a beam 12 formed perpendicularly in the Z-axis direction similarly as shown in FIG. 15, with an addition of two each piezoelectric/electrostrictive elements arranged sandwiching respectiveholes 8.

In the above-described embodiment, by individually controlling a plurality of the piezoelectric elements 2, and by differentiating displacement quantities, easily obtainable is an operation in which an arc-shaped operation within the XZ surface and an expanding-contracting operation in the Z-axis direction are synthesized. By the way, the embodiment shown in FIG. 16 shows a structure which is preferable to the application for such uses as sensing by means of independently performing displacement operations of the upper site 4 and the lower site 4 in FIG. 16.

Furthermore, it is also possible to use one of two piezoelectric elements 2 as a driving element, and the other as a vibration detecting element. In other words, by using the driving portion of the device for detecting a displacement of the movable portion, the driving portion can be functioned as an acceleration sensor or an impact sensor, thus detection of an anomaly of the driving element is made possible, and if a voltage to be applied to the driving element is controlled based on a signal from the detecting element, more precise control of operational quantity is made possible. Further, by detecting a vibration of a site per se where a piezoelectric/electrostrictive device is provided, and then by giving to the movable portion an operation of reverse phase so as to cancel the detected vibration, thus the relative vibration of the movable portion can be suppressed, which is an advantage.

Further, a piezoelectric element is not necessarily formed on each thin plate portion, and the element may be divided into a plurality of elements as required. For example, though not shown, when the element is divided in the Y-axis direction, a displacement can be controlled by each individual piezoelectric elements, thus a displacement in the YZ surface (so-called a flapped component) can be suppressed, and when an element is divided in the Z-axis direction, the element becomes liable to be bent at the divided part, thus an operational quantity of the movable portion is increased and the resolution of the operational quantity can be improved. Further, when a piezoelectric element is divided, one of the divided piezoelectric element can be made as a driving element, and the other as a detecting element, thus realizing a compact structure and detection and control with higher precision.

When a piezoelectric element of each thin plate portions is divided as described above, it is preferable to provide a slit, though not shown, at the thin plate portion between the divided piezoelectric elements. By structuring in this way, since the thin plate portion becomes liable to bend at the slit, an individual piezoelectric element becomes liable to displace, and as the result, a displacement of the piezoelectric element can be efficiently transmitted to the movable portion, which is another advantage.

Of course, when there are two or more driving portions, the movable portion and the fixing portion are not necessarily required to be at both ends of the device, and in an embodiment shown in FIG. 16, the both ends may be positioned by the fixing portions, and the moving portion 4 may be arranged between the fixing portions 5—5.

In such structure, although an operational quantity of the movable portion is reduced, mechanical strength and impact resistance can be improved as the device 1 can be assuredly secured, and the operation within the YZ surface (so-called an operation in a flapped direction) can be suppressed, which is still another advantage.

In a case where a plurality of driving portions are provided as described above, it is preferable that each gaps, though not shown, between each driving portions are structured with a shorter distance compared with the gaps in the fixing portion and the movable portion. This is because an operational quantity can be increased in such structure.

Further, each driving portions may be structured so that a length thereof becomes shorter toward the movable portion. In this structure, at the shorter driving portion, delicate control of a driving quantity becomes possible while maintaining a driving quantity at the longer driving portion, thus it is preferable because a movable portion can be largely operated, and delicate adjustment also becomes possible. Furthermore, although balance with the mechanical strength is to be considered, it is preferable that the device has a notch formed between each driving portions, though not shown. At the notch, a thin plate becomes liable to be bent, thus an operational quantity of the movable portion can be increased. A device according to the present invention has, in addition to advantages described above, a further advantage that a composing materials can be suitably selected for members other than a piezoelectric/electrostrictive element in accordance with required features of each members, since it is not necessary to use a piezoelectric/electrostrictive material in structuring whole of the device. In other words, by composing other members than the piezoelectric/electrostrictive element with a material of lighter weight, the device can be made more resistive against a harmful vibration, and in the similar way, mechanical strength, handling property, impact resistance, and humidity resistance of the device can be easily improved.

Furthermore, as a filler is not needed to use, displacement efficiency due to an inverse piezoelectric effect or an electrostrictive effect is not reduced.

2. Components of Device

Now, though partially overlapping the above-described items, each members composing a device of the present invention is individually described in detail by an embodiment of the device shown in FIG. 1.

(1) Movable Portion and Fixing Portion

A movable portion 4 is a portion to be operated based on a driving quantity of a driving portion 3, to which a variety of members are attached depending on application purposes of the device 1. For example, when the device 1 is used as a displacement element, a shield of an optical shutter is attached, or the device 1 is used as a mechanism for aligning or suppressing ringing of a hard disk, a member requiring alignment, such as a magnetic head, a slider with a magnetic head mounted thereon, a suspension with a slider mounted thereon, or the like may be attached.

A fixing portion 5 is a portion for holding the driving portion 3 and the movable portion 4, and by holding and securing the fixing portion 5 to any base, for example, when used in aligning mechanism of a hard disk, to a carriage arm attached to a VCM (voice coil motor), a fixing plate attached to the carriage arm, or the like, the device 1 as a whole is secured.

Further, there may be a case where an electrode lead or other members for controlling the piezoelectric element 2 may also be arranged. As a material for composing the movable portion 4 and the fixing portion 5, although any materials may be used without any specific limitation as long as stiffness is secured, a ceramics may be preferably used to which the ceramic green sheet laminating method to be described later can be applied. In particular, although zirconia such as fully-stabilized zirconia, partially-stabilized zirconia or the like, alumina, magnesia, silicon nitride, aluminum nitride, a material with titanium oxide as a major component, or the like, may be used, and in addition, a material with a mixture of such materials as a major component may be used, and in view of high mechanical strength and toughness, zirconia, particularly a material with fully-stabilized zirconia as a major component and a material with partially-stabilized zirconia as a major component are preferable.

(2) Driving Portion

A driving portion 3 is a portion to be driven in accordance with a displacement of a piezoelectric element 2, and comprises thin plate portions 6 and 7 facing each other, and film-like piezoelectric elements 2 respectively formed on the surfaces of the thin plate portions 6 and 7.

① Thin plate Portion

Thin plate portions 6 and 7 are flexible thin plate-like members, and have a function of amplifying an expansion-contraction displacement of each piezoelectric elements 2 provided on the surfaces thereof into a bending displacement and transmitting the bending displacement to the movable portion 4.

Accordingly, a shape and a material of the thin plate portions 6 and 7 may be enough if the material has flexibility and mechanical strength enough to resist breakage due to a bending deformation, and the material can be suitably selected paying due consideration to responsibility and operability of the movable portion.

Ordinarily, the thickness of the thin plate portions 6 and 7 is preferably around 2 $\mu$m to 100 $\mu$m, and combined thickness of the thin plate portions 6 and 7 and the piezoelectric elements 2 is preferably 7 $\mu$m to 500 $\mu$m. The width of the thin plate portions 6 and 7 is preferably 50 $\mu$m to 2000 $\mu$m.

As a material for composing the thin plate portions 6 and 7, a ceramics may be preferably used in the similar way as with the moving portion 4 and the fixing portion 5, and zirconia, particularly a material with fully-stabilized zirconia as a major component or a material with partially-stabilized zirconia as a major component, is most preferably used because of large mechanical strength, high toughness, and small reactivity with a piezoelectric film or an electrode material. It should be noted that, of above-mentioned fully-stabilized and partially-stabilized zirconia, the zirconia is stabilized preferably as to be described hereinafter. Namely, as compounds for stabilizing zirconia, yttrium oxide, ytterbium oxide, cerium oxide, calcium oxide, and magnesium oxide may be used. Although zirconia is partially or fully stabilized by adding and including at least one of the above-mentioned compounds, zirconia can be stabilized for desired purpose not only by adding one kind of the compounds but also by adding a combination of the compounds.

It should be noted that, of a quantity of the respective compounds to be added, in case of yttrium oxide and ytterbium oxide, it is 1 to 30 mol %, and preferably 1.5 to 10 mol %, of cerium oxide, 6 to 50 mol % and preferably 8 to 20 mol %, and of calcium oxide and magnesium oxide, 5 to 40 mol % and preferably 5 to 20 mol %, and of all these compounds, particularly yttrium oxide can be preferably used as a stabilizer, and in the case, adding quantity may be 1.5 to 10 mol %, and more preferably 2 to 4 mol %. Furthermore, as an additive to a sintering aid, it is also preferable that alumina, silica, a transition metal oxide or the like may be added within a range of 0.05 to 20 wt %.

It should be noted that, in order to obtain above-mentioned mechanical strength and a stabilized crystal phase, it is desirable that the average crystal grain size of zirconia is 0.05 to 3 $\mu$m, and preferably 1 $\mu$m or less. Further, of the thin plate portions 6 and 7, although a similar ceramic with the movable portion 4 and the fixing portion 5 may be used, as described above, it is preferable that a substantially same material is used in composition thereof in view of reliability of a joined portion, mechanical strength of a device, and reduction in complicated fabricating works.

② Piezoelectric Element

Figure 17:
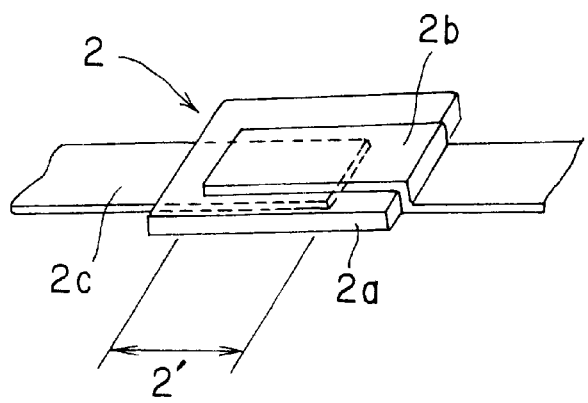
FIG. 17 shows a schematic perspective view of an embodiment of a piezoelectrici/electrostrictive device of the present invention.

A piezoelectric element 2 at least comprises a piezoelectric film, and a pair of electrodes for applying a voltage to the piezoelectric film. Although a conventionally known piezoelectric element such as unimorph-type, bimorph-type or the like may be used, it is preferable that the piezoelectric element 2 is composed of the unimorph-type piezoelectric element, which matches with the device described in this application, since the unimorph-type piezoelectric element is superior in stability of generating displacement quantity, and advantageous in reducing weight. For example, as shown in FIG. 17, a laminated type piezoelectric element 2, or the like, with a lower electrode 2c, a piezoelectric film 2a, and an upper electrode 2b, or the like, laminated thereon in a layer, may be preferably used. Further, in addition to a mechanism where the piezoelectric film 2a is sandwiched by a pair of an upper and a lower electrodes, though not shown, it is also preferable that a piezoelectric element in multi-stair structure is formed by forming a piezoelectric film 2a further on the upper electrode (in this case, the electrode is not called as upper electrode), and forming an upper electrode further on the piezoelectric film 2a.

Figure 18:
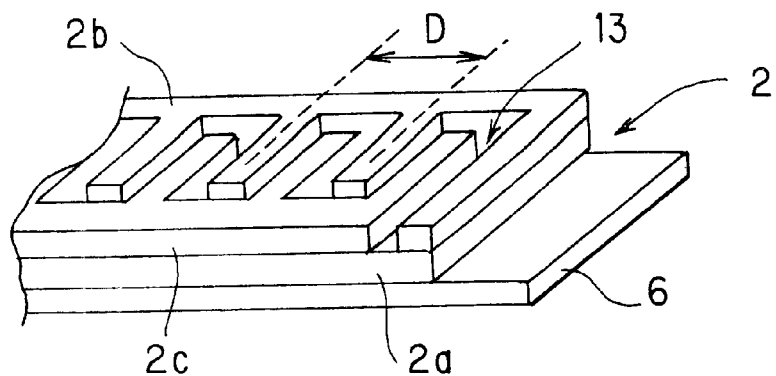
FIG. 18 shows a schematic perspective view of another embodiment of a piezoelectric element constituting a piezoelectric/elecrostrictive device of the present invention.

Also may be used is a piezoelectric element 2, as shown in FIG. 18, comprising a first electrode 2b and a second electrode 2c, both having comb-type structure, in which the first electrode 2b and the second electrode 2c are alternately opposed with a gap 13 of a predetermined width between respective teeth of each combs. In FIG. 18, although a first electrode 2b and a second electrode 2c are arranged on the upper surface of the piezoelectric film 2a overlying the thin plate 6, the electrodes may be formed between the thin plate 6 and the piezoelectric film 2a, or the electrodes may be preferably formed both on the upper surface of the piezoelectric film 2a and between the thin plate 6 and the piezoelectric film 2a. In other words, in a piezoelectric element of the present structure, electrodes are formed on at least one main surface at least of a piezoelectric film 2a.

Figure 19:
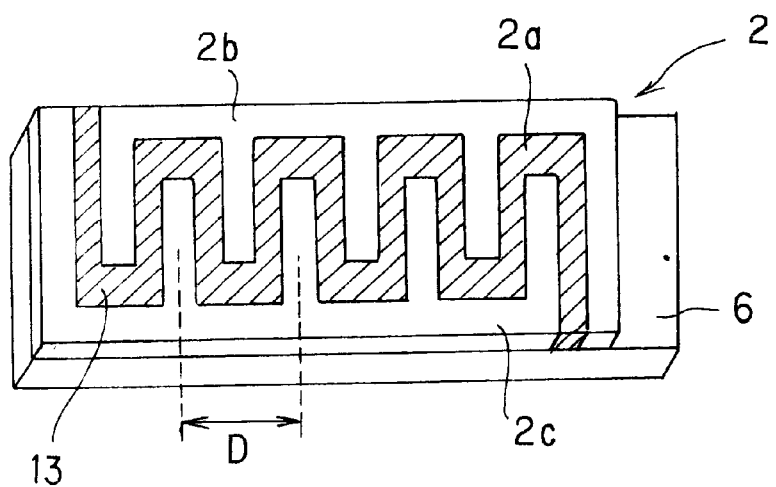
FIG. 19 shows a schematic perspective view of still another embodiment of a piezoelectric element constituting a piezoelectric/elecrostrictive device of the present invention.
Figure 34:
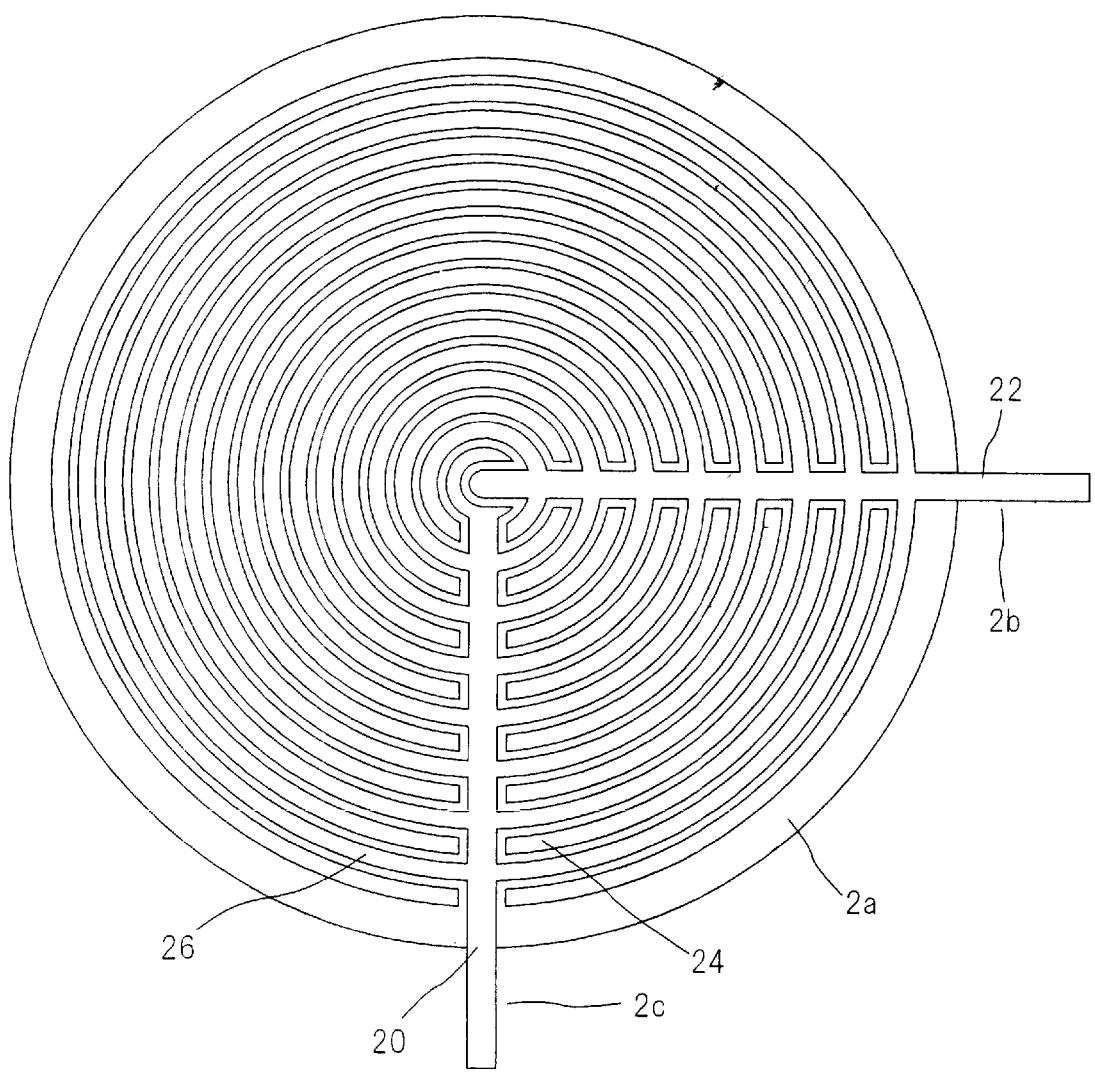
FIG. 34 shows a perspective explanatory view of another embodiment of a piezoelectric element constituting a piezoelectric/electrostrictive device of the present invention.

Furthermore, a piezoelectric element 2 as shown in FIG. 19 also comprises a first electrode 2b and a second electrode 2c, both of comb-type structure, and is structured so that the first electrode 2b and the second electrode 2c are alternately opposed with a gap 13 of a predetermined width between respective teeth of each comb. Although a piezoelectric element 2 is composed so as to embed the piezoelectric film 2a in a gap 13 between the first electrode 2b and the second electrode 2c, such piezoelectric element may also be preferably used in a device according to the present invention. When using a piezoelectric element having comb-type electrodes as is the case with the piezoelectric element shown in the above-mentioned FIG. 18 and FIG. 19, a displacement of the piezoelectric element can be increased by reducing a pitch D between respective teeth of each comb. A shape of a thin plate portion, where a piezoelectric/electrostrictive element according to the present application is formed, is not limited to be rectangular, and a circular form may also be used, and in such case, it is preferable to use a complementary-type piezoelectric/electrostrictive element. In FIG. 34, a pair of electrodes 2b and 2c are structured respectively to have stems 20 and 22, extending toward the center on the piezoelectric/electrostrictive film 2a, respectively with branches 24 and 26 respectively multi-branched from the stems 20 and 22.

It should be noted that, although the piezoelectric element 2 is formed, like the device 1 shown FIG. 1, preferably on the outer surface of the device 1, from a viewpoint that a driving portion can be largely driven, the piezoelectric element 2 may also be formed inside the device 1 (namely in the hole), and may also be formed on both inside and outside of the device 1. It should be noted that, when the piezoelectric element 2 is formed inside the device 1, a method is that the piezoelectric element is simultaneously formed at the time when fabricating the base comprising at least a thin plate portion, a fixing portion and a movable portion, to be hereinafter described, with the piezoelectric operating portion overlapping the fixing portion and/or the moving portion. As a piezoelectric film, although a piezoelectric ceramic is preferably used, an electrostrictive ceramic, a ferroelectric ceramic, or an antiferroelectric ceramic can also be used. However, when the piezoelectric element 2 for a magnetic head or the like is used, it is preferable to use a material having small hysteresis of strain, and a material having the coercive electric field of 10 kV/mm or less is preferred, since the linearity between an operation quantity of the movable portion and a driving voltage or an output voltage is considered to be important.

As a particular piezoelectric ceramics that may be used for the purpose, listed is a ceramic containing lead zirconate, lead titanate, lead magnesium niobate, lead nickel niobate, lead zinc niobate, lead manganese niobate, lead antimony stannate, lead manganese tungstate, lead cobalt niobate, barium titanate, sodium bismuth titanate, potassium sodium niobate, strontium bismuth tantalate, or the like, singly or as a mixture. Particularly, in view that the ceramics has the higher electromechanical coupling factor and piezoelectric constant, and the small reactivity against the thin plate portion (ceramics) at sintering of a piezoelectric film, and a ceramic stabilized in composition is obtainable, a material containing lead zirconate, lead titanate, and lead magnesium niobate as a major component, or a material containing sodium bismuth titanate as a major component may be preferably used.

Further, for the above-mentioned piezoelectric ceramics, oxides of lanthanum, calcium, strontium, m olybdenum, tungsten, barium, niobium, zinc, nickel, manganese, cerium, cadmium, chromium, cobalt, antimony, iron, yttrium, tantalum, lithium, bismuth, tin, or the like may be used singly or as a mixture of ceramics. For example, when lanthanum or strontium is included in a mixture of lead zirconate, lead titanate and lead magnesium niobate which is a major component, an advantage may be obtained that the coercive electric field, piezoelectric characteristics or the like may be made adjustable.

On the other hand, it is preferable that an electrode of a piezoelectric element is a solid at room temperature, and is composed of a highly conductive metal, and such a metal, for example, aluminum, titanium, chromium, iron, cobalt, nickel, copper, zinc, niobium, molybdenum, ruthenium, palladium, rhodium, silver, tin, tantalum, tungsten, iridium, platinum, gold, lead, or the like is used singly or as an alloy of any of these metals. Further, a cermet material dispersed with the same material as a piezoelectric film and/or a thin plate portion may also be used for the purpose.

Selection of a material for an electrode in a piezoelectric element is determined depending on a piezoelectric film forming method. For example, when a first electrode is formed on a thin plate portion and then a piezoelectric film is formed on the first electrode by sintering, it is necessary to use a metal having high melting point such as platinum or the like that is not changed at a sintering temperature of the piezoelectric film. However, since a second electrode, to be formed on a piezoelectric film after the piezoelectric film is formed, can be formed at a lower temperature, a metal having a lower melting point such as aluminum, gold, silver, or the like may be used.

As the thickness of an electrode may also be a factor for reducing a displacement of a piezoelectric/electrostrictive element in not a small degree, specifically for an upper electrode described in FIG. 17, which is formed after sintering a piezoelectric/electrostrictive film, a comb-type electrode described in FIG. 18, or the like, it is preferable to use a material of organic metal paste, from which a finer and thinner film can be obtained after sintering, for example, gold resinate paste, platinum resinate paste, silver resinate paste, or the like.

Although a variety of modes are available for an electrode lead from a piezoelectric element, as a mode shown in FIG. 9 or FIG. 11, in a device 1 having a piezoelectric electrode 2 respectively formed on both thin plate portions 6 and 7 facing each other, a lower electrode 2c of the two piezoelectric elements is commonly used, and drawn out on the fixing portion 5 of one surface where a hole 8 is apertured, and upper electrodes 2b are directly drawn out on the fixing portion 5 on surfaces where each piezoelectric elements 2 are formed. Since such modes have no electrode formed on a part (numeral 9 in FIG. 9) of the fixing portion 5 on the other surface where the hole 8 is apertured, and the part can be used for securing the device, the device can be reliably secured, thus preferably enabling compaction and the like of the device.

Figure 20A:
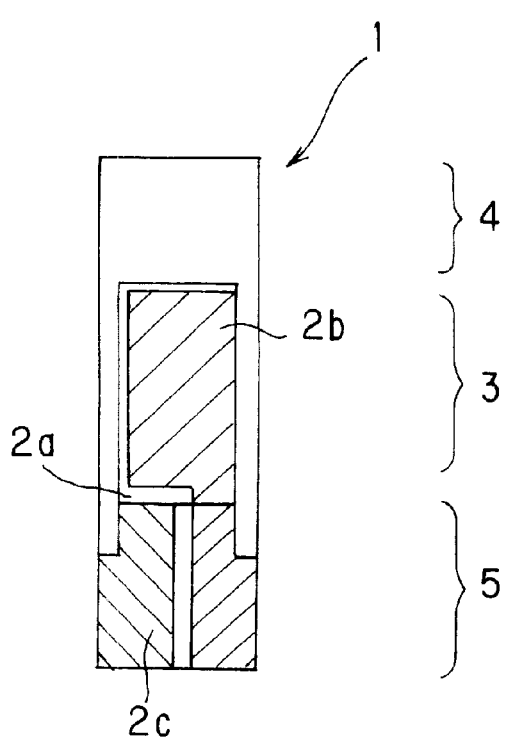
FIGS. 20(a) and (b) show schematic explanatory views of another embodiment of an electrode lead arrangement method of a piezoelectric/electrostrictive device of the present invention.
Figure 20B:
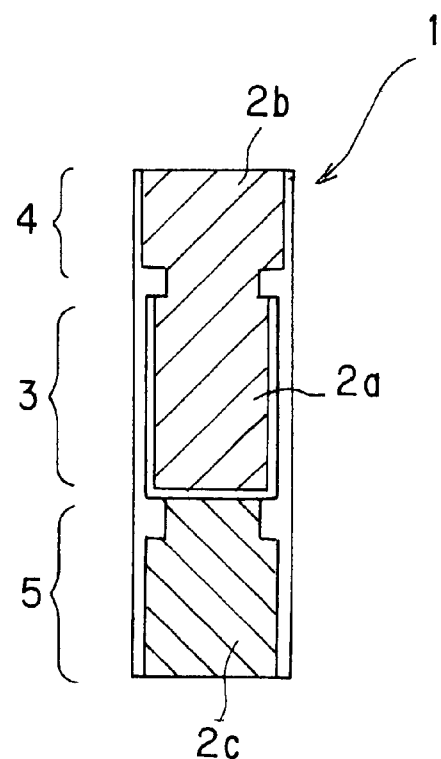

As an alternative mode, as shown in FIG. 20(*a*), both an upper electrode 2b and a lower electrode 2c may be drawn out so as to be in parallel with the fixing portions 5 on surfaces where each piezoelectric elements 2 are formed, or as shown in FIG. 20(*b*), both an upper electrode 2b and a lower electrode 2c may be separately drawn out on the movable portion 4 and on the fixing portion 5 of surfaces where each piezoelectric elements 2 are formed.

3. Fabricating Method of Device

Here, a method of fabricating a device according to the present invention is described.

It is preferable that, for a device according to the present invention, a composing material of each members is a ceramics, and that all components, namely the base, of the device, except a piezoelectric element, comprising a thin plate portion, a fixing portion, a movable portion, and a beam, depending on a case, are fabricated by means of the ceramic green sheet laminating method, while it is preferable that each terminals, such as a piezoelectric/electrostrictive element to start with, may be fabricated by means of the film formation methods for a thin film, thick film, or the like. The ceramic green sheet laminating method, capable of integrally forming each members of the base of the device, is an easy fabricating method in producing highly reliable joined portions and securing stiffness of the device, as the joined portion of each member hardly experiences a change in state over time. In a device according to the present application, reliability in joining is an extremely important point that dominates a feature of the device, as the joined portion of the thin plate portions constituting the driving portion with the fixing portion and the movable portion constitute a fulcrum for development of a displacement. Also, as the present method is superior in productivity and formability, a device of a predetermined shape can be obtained in a short time with good reproducibility. It should be noted that, although a thin plate and a thin plate portion are used in the specification of the present application, in principle, the former means a member related to a green sheet in the fabricating method, and the latter means a portion which constitutes a driving portion together with a piezoelectric element in a laminate.

(1) Fabrication of Laminate

Firstly, a slurry is prepared by adding to mix a binder, a solvent, a dispersant, a plasticizer, and the like to a ceramic powder such as zirconia or the like, then the slurry is degassed, and used in forming a ceramic green sheet having a predetermined thickness by the reverse roll coater method, the doctor blade method, or the like.

Figure 21A:
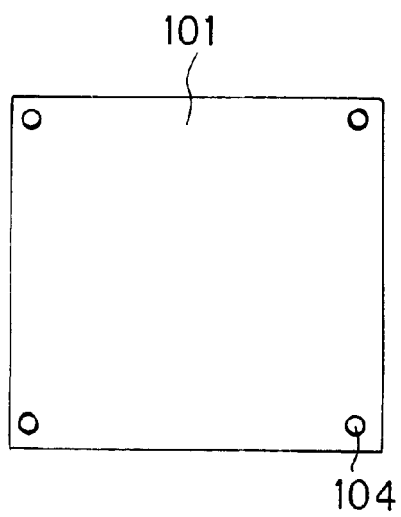
FIGS. 21(a) and (b) show schematic explanatory views of examples of ceramic green sheets to be used in fabricating a piezoelectric/electrostrictive device of the present invention.
Figure 21B:
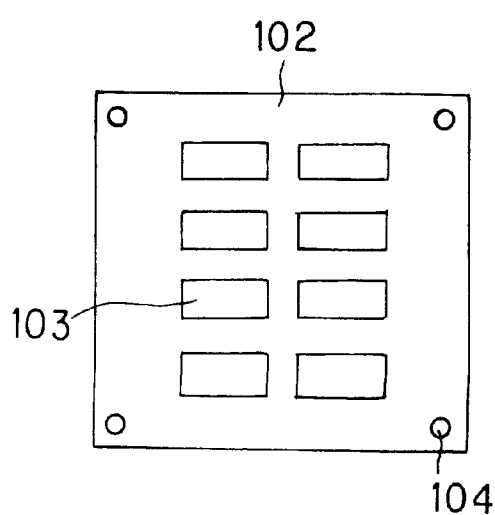

Then, the ceramic green sheet is processed into various shapes such as shown in FIG. 21 by a method such as punching with a die (punching), laser machining, or the like.

A ceramic green sheet 101 schematically represents a ceramic green sheet which mainly constitutes a thin plate after being sintered, and a ceramic green sheet 102 with at least one rectangular hole 103 formed thereon schematically represents a ceramic green sheet which is used for members constituting the movable portion and the fixing portion. In the ceramic green sheet 102, by forming holes 103 so as to be parallel in one or more rows, a plurality of devices can be obtained at a time, or at least one device having a plurality of movable portions can be obtained. By use of at least two ceramic green sheets to become thin plates and at least one ceramic green sheet having at least one hole formed thereon, prepared beforehand, a ceramic green laminate comprising ceramic green sheets to become a pair of thin plates and a series of ceramic green sheets each having at least one hole formed thereon may be prepared by laminating, for example, at least one ceramic green sheet having at least one hole formed thereon between at least two ceramic green sheets to become the thin plates. Of course, there is no specific limitation on a preparing method of a ceramic green laminate, in other words, on a laminating sequence of a ceramic green sheet constituting the thin plate and the green sheet having at least one hole formed thereon, and ordinarily laminating is possible at an optional sequence as long as the laminate gives any inconvenience to processing steps to follow.

That is, steps for preparing the ceramic green laminate include, a step of preparing ceramic green sheets to become a pair of thin plates so as to be laminated facing each other, a step of preparing ceramic green sheets to become a pair of thin plates so as to be respectively laminated facing each other on the outermost layer, a step of preparing a ceramic green sheet to become a thin plate laminated with at least one ceramic green sheet having at least one hole formed thereon, a step of preparing a ceramic green sheet to become a thin plate laminated with a desired number of the ceramic green sheet each having at least one hole formed thereon, a step of preparing the at least one ceramic green sheet having at least one hole formed thereon laminated with ceramic green sheets to become a pair of thin plates on the outermost layer opposed each other, a step where two laminates A from a ceramic green sheet to become a thin plate laminated with at least one ceramic green sheet having at least one hole formed thereon are prepared, and a laminate B laminated with one or a plurality of ceramic green sheets each having at least one hole formed thereon is prepared, and when the two laminates A are laminated so as to have respective thin plates to be the outermost layers, the laminating is performed through the intervention of the one ceramic green sheet with at least one hole formed thereon or the laminate B, and the like.

Figure 28A:
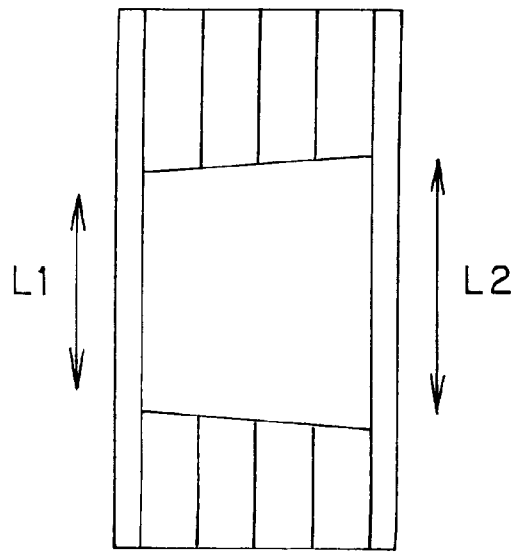
FIG. 28(a) shows a schematic sectional view of a case where a ceramic green sheet with at least one hole formed thereon mounted on a plastic film is not used.

It should be noted that, when fabricating a device according to the present application by use of such ceramic green sheet laminating method, in some cases when a hole is formed by laminating thick sheets as shown in FIG. 28(a), differences in dimensions between lengths L1 and L2 of thin plates related with the driving portion is liable to occur due to lowered machining precision, shift of a position by deformation of sheets at laminating caused by contraction of the ceramic green sheets, differences in dimension precision accompanied by machining when a thick ceramic green sheet is used, or the like. The differences in the dimensions of L1 and L2 are represented intact by differences in a displacement in the left and right direction (the X-axis direction) in FIG. 28(a).

Figure 28B:
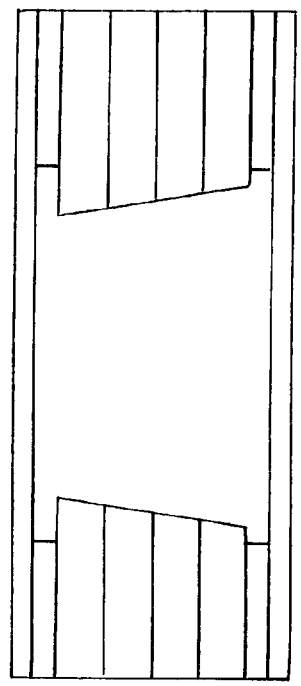
FIG. 28(b) shows a schematic sectional view of a case where the device is fabricated in that a ceramic green sheet mounted on a plastic film and with at least one hole formed thereon is fabricated by laminating on the outermost layer of the laminate of green sheets each with at least one hole formed thereon, and then the plastic film is removed and a green 'sheet constituting a thin plate is laminated.

For such problems, a step is adopted that, when laminating at least a plurality of ceramic green sheets each having at least one hole formed thereon, a ceramic green sheet having at least one hole formed thereon which is mounted on a plastic film is laminated on a surface of the outermost layer of the ceramic green laminate having at least one hole formed thereon in such a manner that the plastic film becomes the new outermost layer, and after the holes are accurately aligned, the plastic film is removed, or a step is adopted in that a ceramic green sheet having at least one hole formed thereon which is mounted on a plastic green sheet film is laminated on a ceramic green sheet to become the thin plate in such a manner that the plastic film constitutes the outer layer, and after the holes are accurately aligned, the plastic film is removed. By adopting the step described above, not only deformation at the time when handling a ceramic green sheet, is substantially avoided, but also shapes of both surfaces constituting the outermost layers can be made identical, thus the hole can be accurately aligned, as shown in FIG. 28(b), which improves lamination precision, and dimensions can also be stabilized by improved machining precision, which further improves a feature of the device, for example, a displacement feature.

Of fabricating methods using the plastic film, the former method requires less number of laminating steps to obtain a final laminate, and is an effective method in reducing fabricating steps, while the latter method is advantageous when providing a bonding auxiliary layer to be hereinafter described for ensuring bonding property at the laminating interface.

In other words, with regard to the number of laminating steps, in the former method, lamination of a ceramic green sheet formed on a plastic film with another ceramic sheet having a hole can be performed at a time, and respective lamination of opposing surfaces from which a plastic film is removed after lamination with a ceramic green sheet to become a thin plate can be performed at a time. A total number of laminating steps, for example, in this case, can be minimum two times. However, in the latter method, the thin plates facing each other have to be laminated with a ceramic green sheet to become a thin plate and a ceramic green sheet having at least a hole which is mounted on a plastic film, respectively in separate steps, and thereafter to be laminated further with a ceramic green sheet having a hole formed thereon. Therefore, a total number of laminating steps is minimum three, more laminating steps than the former method.

Further, the bonding auxiliary layer for improving the laminating property of a ceramic green sheet is, ordinarily, formed covering substantially whole surface of a green sheet prior to machining of the hole or the like, and a predetermined hole is thereafter formed by punching with a die or other methods, and a ceramic green sheet thus made is laminated in predetermined number. When a ceramic green sheet thus made is applied to the former method, a bonding auxiliary layer is to be formed on a laminating surface with the thin plate after removal of the film. At this time, although a shape is accurately defined by machining or the like with a die, it is very likely that precision may deteriorate by formation of the bonding auxiliary layer. Alternatively, a bonding auxiliary layer may be provided on a ceramic green sheet constituting a thin plate. In this case, however, as variation in thickness of a bonding auxiliary layer is ordinarily larger than variation in thickness of a ceramic green sheet constituting a thin plate, not only the total thickness variation is increased, but also the thin plate is thickened by the thickness of the bonding auxiliary layer, thus occurring decrease of the feature of the device. Contrarily, when a bonding auxiliary layer is applied to the latter method, the bonding auxiliary layer can be formed on the ceramic green sheet in a state mounted on a plastic film, precision of the hole is secured by precision of a die, and a ceramic green sheet to become a thin plate is not processed in any way, thus high laminating reliability can be compatible with dimension precision. A surface where a plastic film is exfoliated and removed can be secured of laminating reliability by a bonding auxiliary layer formed on a separate ceramic green sheet with a hole formed thereon to be laminated on the surface.

In such way, although an object to obtain a stabilized state of the thin plates is shared by both methods, there are respective features in fabricating processes, and therefore a suitable technique may be selected depending on structure or the like of a laminate.

It should be noted that a ceramic green sheet having at least one hole formed thereon which is mounted on a plastic film includes not only a ceramic green sheet having at least one hole formed thereon prepared by punching with a die or laser-beam processing of a ceramic green sheet on a plastic film, but also a ceramic green sheet prepared by pasting a plastic film on a ceramic green sheet having at least one hole formed thereon, previously formed in a desired shape. Further, it is preferable that the plastic film is a poly (ethylene-terephthalate) film in view of exfoliation, mechanical strength, or the like. Furthermore, it is preferable that a thickness of a ceramic green sheet on the plastic film is thinner, and more preferably as thick as equivalent to the thickness of a ceramic green sheet for a thin plate. This is because by thinning the thickness of a ceramic green sheet, machining precision of the ceramic green sheet per se can be improved. In order that specifically a ceramic green sheet to become a thin plate can be handled with ease, stretching and sagging of a ceramic green sheet can be prevented, and shape stability of thin plates can be promoted, it is preferable that a ceramic green sheet is handled with a plastic film attached thereto.

Some particular examples when preparing a ceramic green laminate are hereinafter described. The examples given are merely illustrative, and it is needless to say that, when preparing a ceramic green laminate, methods are not limited to those described herein.

LAMINATING EXAMPLE 1 ceramic green sheet 1 (hereinafter called "GS") for forming a thin plate, a holed GS 1, a holed GS 2, a holed GS 3, a holed GS 4, and a holed GS 2, as shown in FIG. 32, are overlaid in the sequence, then compressed to produce an integrated ceramic green laminate.

LAMINATING EXAMPLE 2

Step 1: A GS1 for forming a thin plate is placed over a holed GS1, then the sheets are compressed to produce an integrated ceramic green laminate.

Step 2: A holed GS4 is placed over a thin plate forming ceramic green sheet 2, then the sheets are compressed to produce an integrated ceramic green laminate.

Step 3: An integrated ceramic green laminate obtained in step 1, a holed GS2, a holed GS3, an integrated ceramic green laminate obtained in step 2 are overlaid in the sequence, and then compressed to produce an integrated ceramic green laminate.

LAMINATINED EXAMPLE 3

Step 1: A holed GS1, a holed GS2, a holed GS3, a holed GS4 are overlaid in the sequence, and then compressed to produce an integrated ceramic green laminate.

Step 2: A GS1 for forming a thin plate, an integrated ceramic green laminate obtained in step 1, and a thin plate forming GS2 are overlaid in the sequence, and then compressed to produce an integrated ceramic green laminate.

LAMINATING EXAMPLE 4

Step 1: A holed GS2 is placed over a holed GS3, and the sheets are compressed to produce an integrated ceramic green laminate.

Step 2: A GS1 for forming a thin plate, a holed GS1, an integrated ceramic green laminate obtained in step 1, a holed GS4, and GS2 for forming a thin plate are overlaid in the sequence, and then compressed to produce an integrated ceramic green laminate.

Ceramic green laminates obtained by the above-described laminating examples 1 to 4 are sintered to produce an integrated sintered body. However, the above examples do not show every fabricating method of the present invention, and the number and the sequence of the compressing are specifically not limited.

The number and the sequence of the compressing are suitably determined so as to obtain desired structure depending on structure, for example, shape of a hole, number of holed ceramic green sheets, number of thin plate forming ceramic green sheets, and the like.

Of course, a shape of the hole is not necessarily to be the same for all, and is determined depending on desired function. Also, number of sheets and thickness of each ceramic green sheet are not specifically limited.

Applying a heat treatment which further improves laminating property can be advantageously adopted to above-described compressing. Also, a paste mainly being a ceramic powder (preferably, a composition same as or similar to a ceramic used for a ceramic green sheet is desirous in view of securing reliability), and a binder, a slurry, and the like are coated and printed to make a bonding auxiliary layer, thus advantageously improving laminating property of a ceramic green sheet interface.

Further, a protrusion may be provided at a portion on an outer layer surface of at least one side of the outermost layer of the ceramic green laminate except at least a thin plate portion. Although a device according to the present application is formed of a piezoelectric/electrostrictive element ordinarily by a known method such as the screen printing method on an outer surface of the thin plate portions facing each other, when a piezoelectric/electrostrictive element is formed, for example, by the screen printing method, a damage for an element can be prevented, since an element surface formed on the opposite surface is prevented from directly touching a mount such as a stage for printing, a setter for sintering, or the like, by the protrusion formed. Further, by suitably selecting the height of the protrusion, a thickness of an element can also be controlled. The protrusion can be formed on a sintered body of a green laminate, namely on a ceramic laminate, however, from a viewpoint of stability as a structure and stability of dimensions, it is more preferable that the protrusion is formed on a green laminate and integrated therewith by sintering.

Figure 23A:
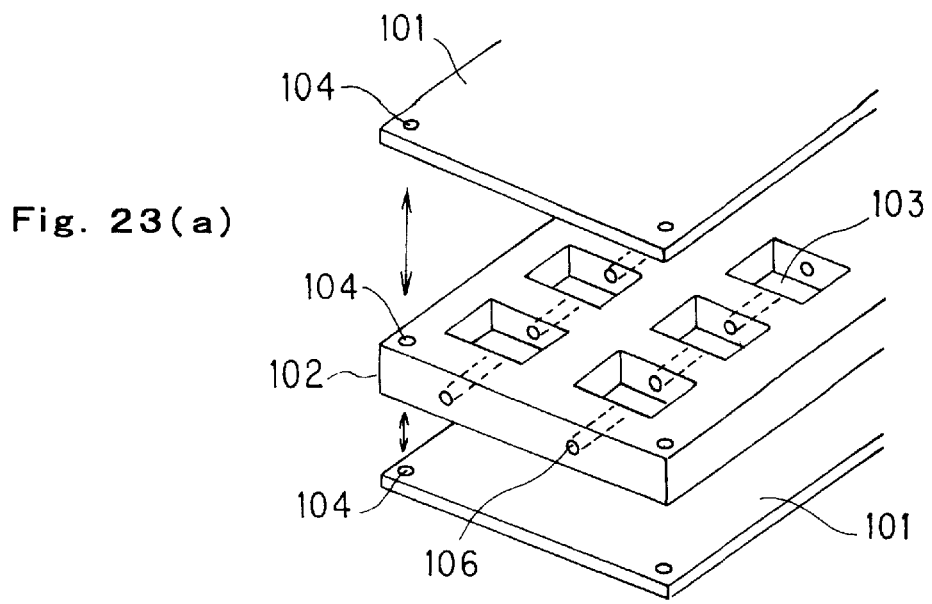
FIGS. 23(a), (b), (c), and (d) show process views of an embodiment of a fabricating method of a piezoelectric/electrostrictive device of the present invention.

An example of a method of fabricating according to the present invention is described. As shown in FIG. 23(a), a ceramic green sheet 101 constituting a thin plate, a ceramic green laminate 102 which is made by laminating a desired number of ceramic green sheets each with at least one hole formed thereon, and a ceramic green sheet 101 constituting a thin plate, are laminated in the sequence while performing alignment by means of reference holes 104, and then integrated by thermo-compression bonding or the like, to produce a green laminate. When the ceramic green laminate 102 is too thick, green laminates 105 each having a thickness halved into an upper portion and a lower portion as shown in FIG. 22 are first formed, and then bonded together so as to have holes 103 opposed each other to produce a final green laminate 108. Furthermore, when fabricating a structure having a hollowed portion as a structure shown in FIG. 8, if respective green sheets are laminated in a sequence, and then integrated by thermo-compression bonding or the like, there occurs portion where pressure is not applied depending on the portion, thus lowering laminating reliability. In such case, in order that laminating pressure applies to every portion, it is preferable that ceramic green sheets are selected, and then laminated and integrated to form groups of components beforehand, and then a group of ceramic green sheets in a form of components are laminated to produce a laminate of the final shape.

It should be noted that, in a laminate 108, a hole 106 communicating a part to be a hole 103 of a ceramic green sheet 102 with the outside space is to be formed, or a communicating hole 106 is to be bored after the laminate is completed. However, as long as respective holes 103 are communicated with the outside space, the shape of the communicating hole 106 is not specifically limited, and a plurality of holes 103 may penetrate all through as shown in FIGS. 23(a) and (b), or the holes 103 may individually communicate with the outside space as shown in FIG. 23(d).

Although a ceramic green laminate integrated in such a method is then sintered at a temperature around 1200 to 1600° C. to be described later, a ceramic laminate obtained by the sintering may have an unintended warpage. In such case, it is preferable the laminate is flattened by being re-sintered under loading a weight thereon at a temperature near the above-described sintering temperature to flatten (hereinafter referred to as warpage correction). In the warpage correction, it is preferable that a planar porous ceramic board of alumina or the like is used as a weight. Further, in the warpage correction, a preferable method is that the step follows sintering, or a weight is placed already at sintering to have the laminate flattened simultaneously at sintering.

(2) Formation of Piezoelectric/Electrostrictive Element

Figure 23B:
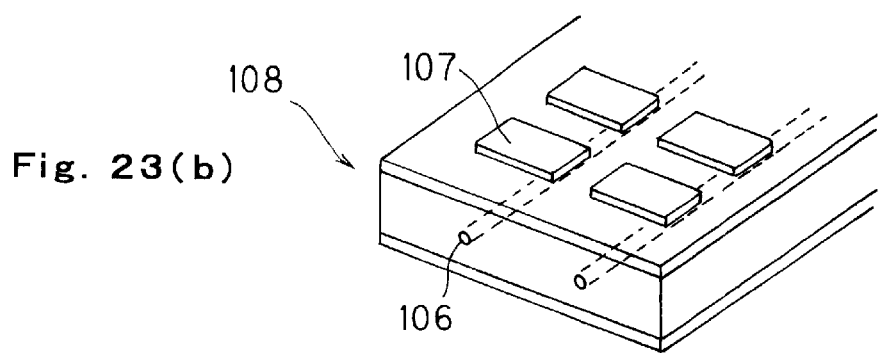

In the method of fabricating of the present invention, a piezoelectric element 107 can be formed on a surface of a thin plate of a ceramic laminate by a thick-film forming method such as screen printing method, dipping method, coating method, electrophoresis method, or a thin-film forming method such as ion beam method, sputtering method, vacuum evaporation, ion plating method, chemical vapor deposition method (CVD), plating, or the like (FIG. 23(b)). It is preferable that a piezoelectric element is formed by an above-described method so that at least one edge portion of a piezoelectric operating portion of the piezoelectric/electrostrictive element exists at a part of the fixing portion and/or the movable portion.

By forming a piezoelectric element by film-forming methods in this way, a piezoelectric element and a thin plate can be integrally joined and arranged without using an adhesive, thus reliability and reproducibility can be secured, and integration is made easy. However, in the method of fabricating in the present invention, it is preferable that a piezoelectric element 107 is formed by a thick-film forming method. According to the method, a piezoelectric film can be formed by use of a paste and a slurry, or suspension or emulsion, sol, or the like, of which a major component is a piezoelectric ceramic of average particle size of 0.01 to 5 $\mu$m, and preferably of 0.05 to 3 $\mu$m, and an improved piezoelectric operation characteristic can be obtained. Particularly, the electrophoresis method has an advantage that a film can be formed in high density and high shape precision. The screen printing method, on the other hand, permits film formation simultaneously with pattern formation, and therefore can be preferably adopted as a method of fabricating a device according to the present invention.

Particularly, a ceramic green laminate 108 is sintered at a predetermined condition, preferably at a temperature of 1200° C. to 1600° C., then a lower electrode is printed and sintered at the predetermined position of the surface of a thin plate (a sintered ceramic green sheet 101), then a piezoelectric film is printed and sintered, and further an upper electrode is printed and sintered, thus a piezoelectric element can be formed (FIG. 3(b)). Further, an electrode lead for connecting an electrode with a driving circuit is printed and sintered. Here, if materials for each members are selected so as to have a sequentially lowering sintering temperature like platinum (Pt) for the lower electrode, lead zirconate titanate (PZT) for the piezoelectric element, gold (Au) for the upper electrode, and silver (Ag) for the electrode lead, a once-sintered material is, at any sintering stage, never re-sintered, and occurrence of such troubles as exfoliation and aggregation of electrode members or the like can be avoided.

It should be noted that, by selecting proper materials, each members of a piezoelectric element 107 and an electrode lead can be sequentially printed, and integrated sintering at one time is made possible, while each electrode or the like can be provided at a lower temperature after the piezoelectric film is formed. Further, each member of the piezoelectric element and an electrode lead may be formed by thin-film forming methods such as sputtering method, vacuum evaporation, or the like, and in this case, heat treatment is not necessarily required. Furthermore, it is preferable that a piezoelectric element 107 is formed beforehand at a position at least finally constituting the thin plate portion on a ceramic green sheet 101, so that the piezoelectric element 107 is simultaneously sintered with a ceramic green laminate 108. At simultaneous sintering, the ceramic green laminate can also be sintered with all composing films of the piezoelectric element, and a simultaneous sintering method exclusively of a lower electrode and a ceramic green sheet 101, a simultaneous sintering method of composing films except an upper electrode and a ceramic green sheet, and the like may be listed. As methods for simultaneous sintering of a piezoelectric element 107 and a laminate 108, a method is listed in that a piezoelectric film is formed by a press forming method using a die, or a tape-forming method using a slurry material, or the like, the piezoelectric film still to be sintered is laminated on a ceramic green sheet 101 by the thermo-compression bonding or the like, and simultaneously sintered to produce a movable portion, a driving portion, a thin plate, and a piezoelectric film at the same time. In this method, however, it is necessary to form an electrode on a thin plate or a piezoelectric film beforehand by use of an already described film-forming method. Further, in addition to above-described methods, an electrode and a piezoelectric film both respectively being composing members of a piezoelectric element are formed at positions at least finally constituting thin plates of a ceramic green sheet 101 by the screen printing to sinter simultaneously.

Sintering temperature for a piezoelectric film is suitably determined depending on composing materials of the film, and the temperature is generally 800° C. to 1400° C., and preferably 1000° C. to 1400° C. In this case, in order to control composition of the piezoelectric film, it is preferable to sinter under the presence of an evaporation source of the materials of the piezoelectric film. It should be noted that, when simultaneously sintering a piezoelectric film and a ceramic green laminate 108, sintering conditions of the both are to be united.

Furthermore, when fabricating a device with a piezoelectric element respectively formed on each of a pair of thin plates facing each other, a piezoelectric film, an electrode, and the like may be printed on each of both surfaces of a ceramic laminate. In such case, it is necessary to take a measure so that the printed piezoelectric films, electrodes, and the like are prevented from being attached or touched to a printing stage ① by printing on a printing stage having a concave provided thereon, or ② by first forming a frame-like convex in the surrounding of a printing position on at least one printing surface of the ceramic laminate, and then the surface where the convex is formed is printed, followed by printing of the other surface, or the like. Further, in sintering the above-described piezoelectric film, specifically in a case with a structure where a piezoelectric element is formed on each of both surfaces of a ceramic laminate, it is preferable that the sintering atmosphere of both surfaces is the same. For example, ordinarily, a board such as a setter or the like each provided with a ceramic laminate having a piezoelectric element (film) formed thereon is sintered, and in such case, a gap between each setter to be stacked is adjusted to have the same space between the piezoelectric film and a setter at each stacking.

(3) Cutting of Laminate

Figure 23C:
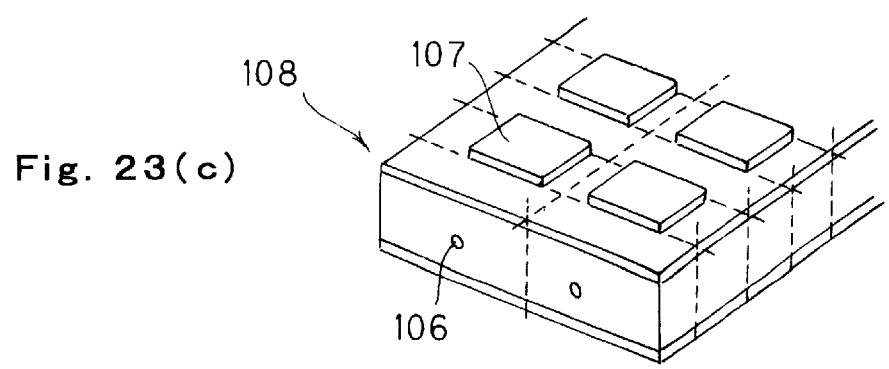
Figure 23D:
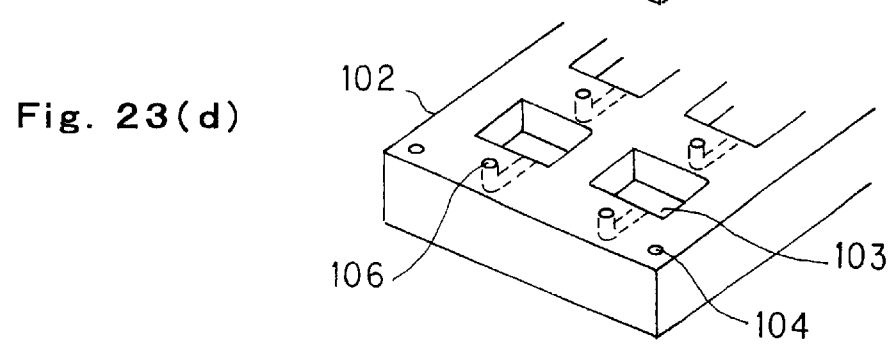

A sintered body of a laminate with an above-described piezoelectric element formed thereon is formed of a notch as required, and processed of coating, shielding, or the like about a piezoelectric element and an electrode lead, then cut in the laminating direction of the ceramic green sheet, thus rectangular holes 103 are apertured on the side face of the laminate, and a plurality of devices are simultaneously fabricated (FIG. 23(c)). As methods for cutting, in addition to the dicing machining, wire-saw machining or the like (mechanical machining), the laser-beam machining by YAG laser, eximer laser, or the like, and the electron-beam machining can be applied. When cutting a laminate into each desired units, it is preferable that the cutting body is heat treated at 300 to 800° C. This is because defects such as micro-cracks or the like which are liable to be caused inside the sintering body by machining can be removed by the heat treatment, thus contributing to improvement in reliability. Furthermore, it is also preferable that the sintered body is left for aging at a temperature around 80° C. for at least about 10 hours after the sintering. This is because various stresses or the like suffered during the fabricating process can be relieved by the processing, thus contributing to improve the feature.

Figure 24A:
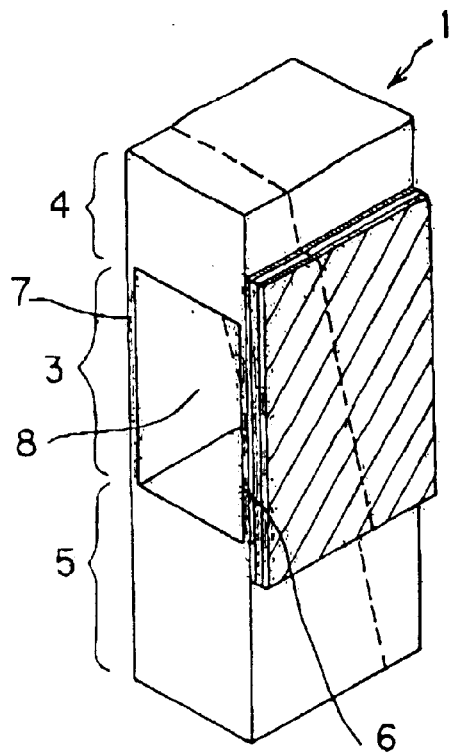
FIG. 24(a) shows a perspective view of a cutting position.
Figure 24B:
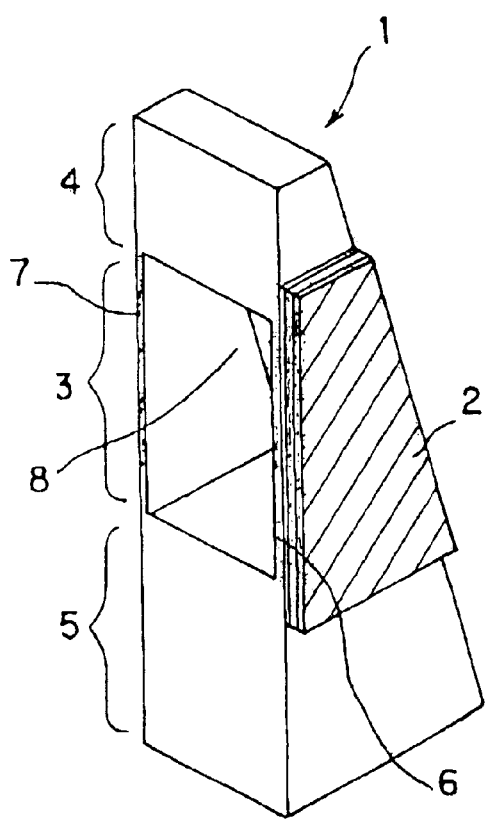
FIG. 24(b) shows a perspective view of a device after being cut.

In a fabricating method according to the present invention, a laminate is cut so that a hole of desired shape, for example, a rectangular hole 103, is apertured on a side face of the laminate. Such cutting has an advantage that not only a plurality of devices are separated but also thin plates and a hole (in case of the device of FIG. 1, thin plates 6 and 7 and a hole 8) are simultaneously formed, and is preferable in that a structure, which is complicated and hard to fabricate since two or more rectangular solids are coupled by a thin plate, can be obtained with ease. Instead, a laminate may be cut into two at a section indicated by dotted lines in FIG. 24(a) to fabricate two devices. By cutting in this way, weight of a movable portion is made lighter and as the result a resonant frequency is advantageously increased. Further, stiffness in the X-axis direction and the Y-axis direction can be secured on a wide portion of the driving portion 3, thus the laminate is also strong against impacts from the both directions. According to this method of fabricating, two devices can be fabricated from one device, thus productivity can be improved. It should be noted that, in FIG. 24(a), although a surface of one side of the device where the hole is apertured is perpendicular relative to the base, the surface may have a structure having an inclination similar to that of the opposing surface.

Further, by suitably changing the number of formation and the position of formation of the hole 103 on the ceramic green sheet 102, or cutting position of a laminate 108, a device having a plurality of driving portions or a device having different length of the driving portion can be formed with extreme easiness. Furthermore, if the laminate 108 and a piezoelectric element 107 are simultaneously cut, a device having a thin plate portion and a piezoelectric element in the same width can be formed, which is preferable. Although such cutting may be performed in a green state prior to sintering, it is preferable to cut a sintered body, in order that dimension precision can be raised and escaped particles of each ceramic powder, or the like, can be prevented.

Furthermore, a device according to the present invention may be fabricated by means of the pressure forming method and casting method using a forming die, injection molding method, photolithography, or the like, in addition to the above-described fabricating methods using a ceramic green sheet. Although a device can also be fabricated by bonding each composing members prepared as separate bodies, there is a problem that bonded portions are liable to be damaged or the like, in addition to low productivity, which is also a problem connected with reliability.

4. Application Example of Device

At the last, as an example of application of a device according to the present invention, description is made about an example where a device according to the present invention is applied to a displacement element used in an optical shutter. An "optical shutter" in the present specification means a functional element for controlling transmission and shielding of the light by relatively moving two shields, and the optical shutter, being capable of performing ON/OFF control of the light and control of quantity of the light, can be functioned as an optical switch and an optical diaphragm.

In the optical shutter of the present invention, at least one shield of the two shields is mounted on the movable portion of the device of the present invention.

Figure 25A:
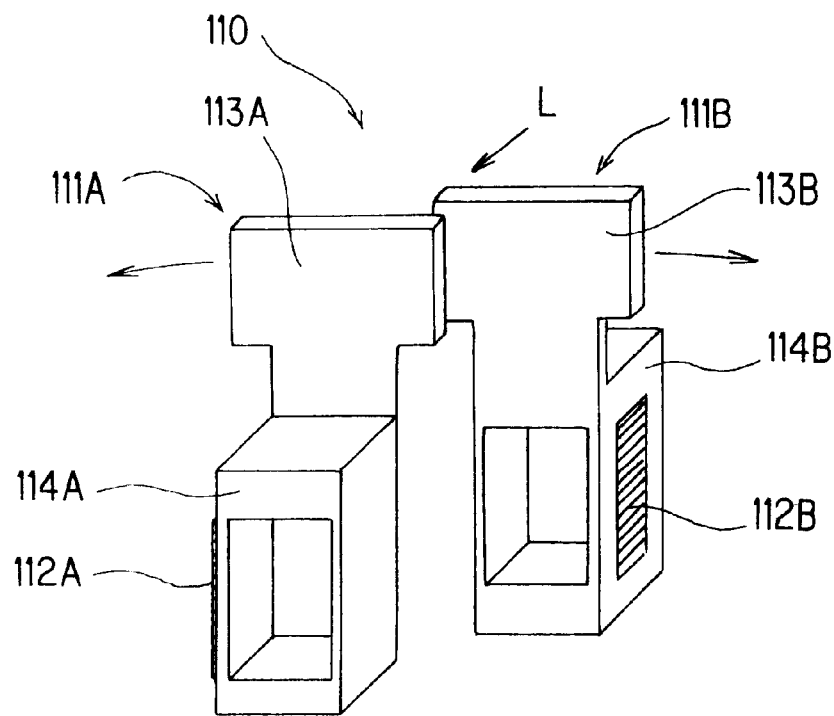
FIG. 25(a) shows a perspective view thereof.

For example, an optical shutter 110 shown in FIGS. 25(a) and (b) comprises units 111A and 111B each provided with a device of the present invention and a shield, and two shields 113A and 113B are respectively attached to movable portions 114A and 114B, mutual planar surfaces are arranged to be in parallel, and a part each of the planar surfaces are arranged to overlap each other.

Figure 25B:
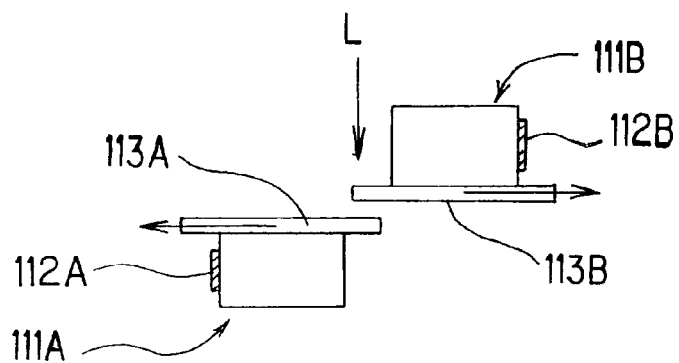
FIG. 25(b) shows a top view thereof.

Although an optical shatter 110 shields the light L in a state shown in FIG. 25, overlapping condition of the shields 113A and 113B is changed, and ON/Off of the light and quantity of the light can be controlled, since a shield 113A moves to the left and a shield 113B moves to the right in FIG. 25, by applying voltages of the same phase to piezoelectric elements 112A and 113 formed on the moving portion of the device.

Figure 26A:
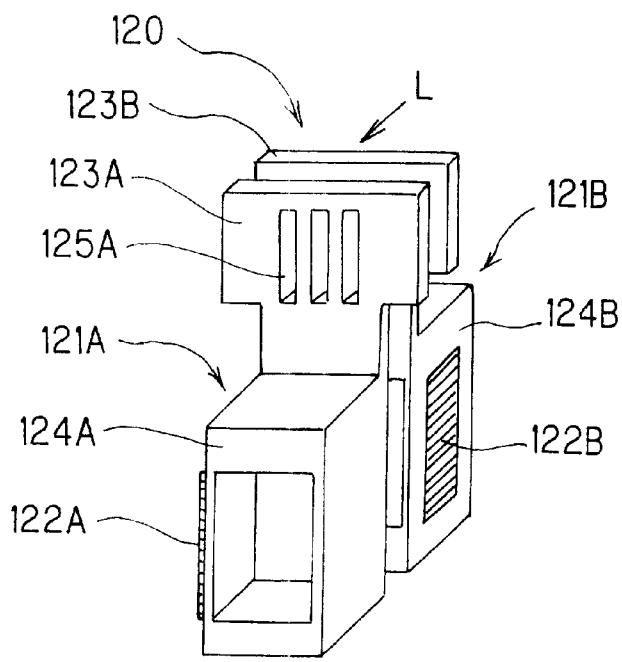
FIG. 26(a) shows a perspective view.

Further, an optical shutter 120 shown in FIG. 26(a) comprises two units 121A and 121B each provided with a device of the present invention and a shield, and two shields 123A and 123B are attached to movable portions 124A an d 124B of respective devices, and respective planar surfaces are arranged to be in parallel and so as to have the planar surfaces totally overlapped against an incident direction of the light L. On the shields 123A and 123B, slits 125A and 125B are respectively formed at opposing positions.

Figure 26C:
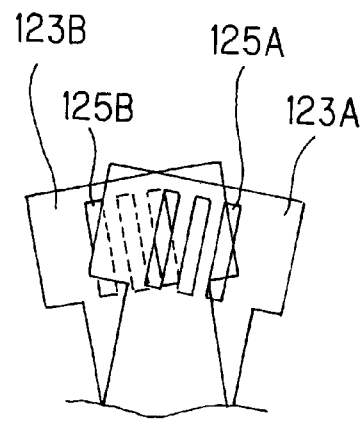
FIG. 26(c) shows an enlarged view of a shield thereof.
Figure 26B:
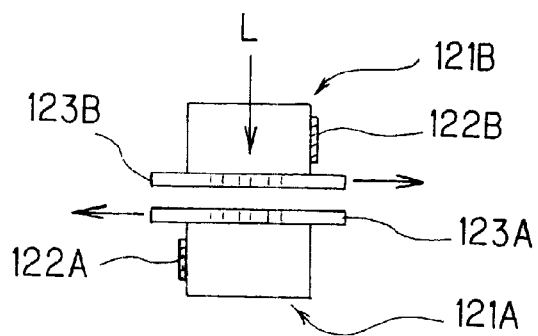
FIG. 26(b) shows a top view.

Although the optical shutter 120 transmits the light L through the slits 125A and 125B in a state as shown in FIGS. 26(a) and (b), overlapping condition of the slits 125A and 125B is changed, and ON/OFF of the light and quantity of the light can be controlled, since the shield 123A moves to the left and shield 123B moves to the right in FIGS. 26, by applying voltages of the same phase to piezoelectric elements 122A and 122B formed on the movable portion of the device. Although, FIG. 26(c) shows a state where a part of the light is transmitted, it is also possible to completely shield the light L, by changing the shape and forming position of the slits 123A and 123B.

Contrarily, in a state shown in FIGS. 26(a) and (b), a structure may be that the slits 125A and 125B do not overlap each other but the light L is shielded, and by moving shields 123A and 123B, the slits 125A and 125B overlap each other to allow the light L to be transmitted. Although, in FIGS. 25 and 26, examples where two shields are attached to respective devices are shown, the optical shutter of the present invention can control transmission and shielding of the light only by attaching at least one shield on the device and moving only the shield. However, it is preferable that both shields are attached to the device in the point that relative movement quantity of the shields can be increased. Further, in examples shown in FIGS. 25 and 26, while an optical shutter comprises two units, the optical shutter may comprise three or more units. In such case, by setting a variety of movement directions for a plurality of shields, the optical shutter may be used as an optical diaphragm or the like with changed degrees of aperture at overlapping portions. As the optical shutter of the present invention has a shield attached to the movable portion of the device of the present invention, operation of the shield in a flapped direction is controlled. In other words, as a shield always moves facing straight to the incident direction of the light, the optical shutter can be preferably used in the point that ON/OFF of the light and quantity of the light can be controlled at higher precision.

Now, a device shown in FIG. 9 is mounted with a piezoelectric element shown in FIG. 17, and a material including platinum as a major component is used for a lower electrode, a material including solid solution of lead magnesium niobate-lead titanate zirconate as a major component is used for a piezoelectric material, and gold is used for an upper electrode, and respective members are printed by the screen printing so that the thickness after sintering becomes 3 $\mu$m, 10 $\mu$m, and 0.3 $\mu$m respectively, thus a device is completed. It should be noted that sintering is performed respectively at 1300° C., 1250° C. and 600° C. at each printing. By the way, the dimensions of respective members according to FIG. 1 are as follows.

a: 0.3 mm, b: 0.3 mm, c: 0.32 mm
d: 0.01 mm, e: 1 mm, f: 0.3 mm

Figure 27:
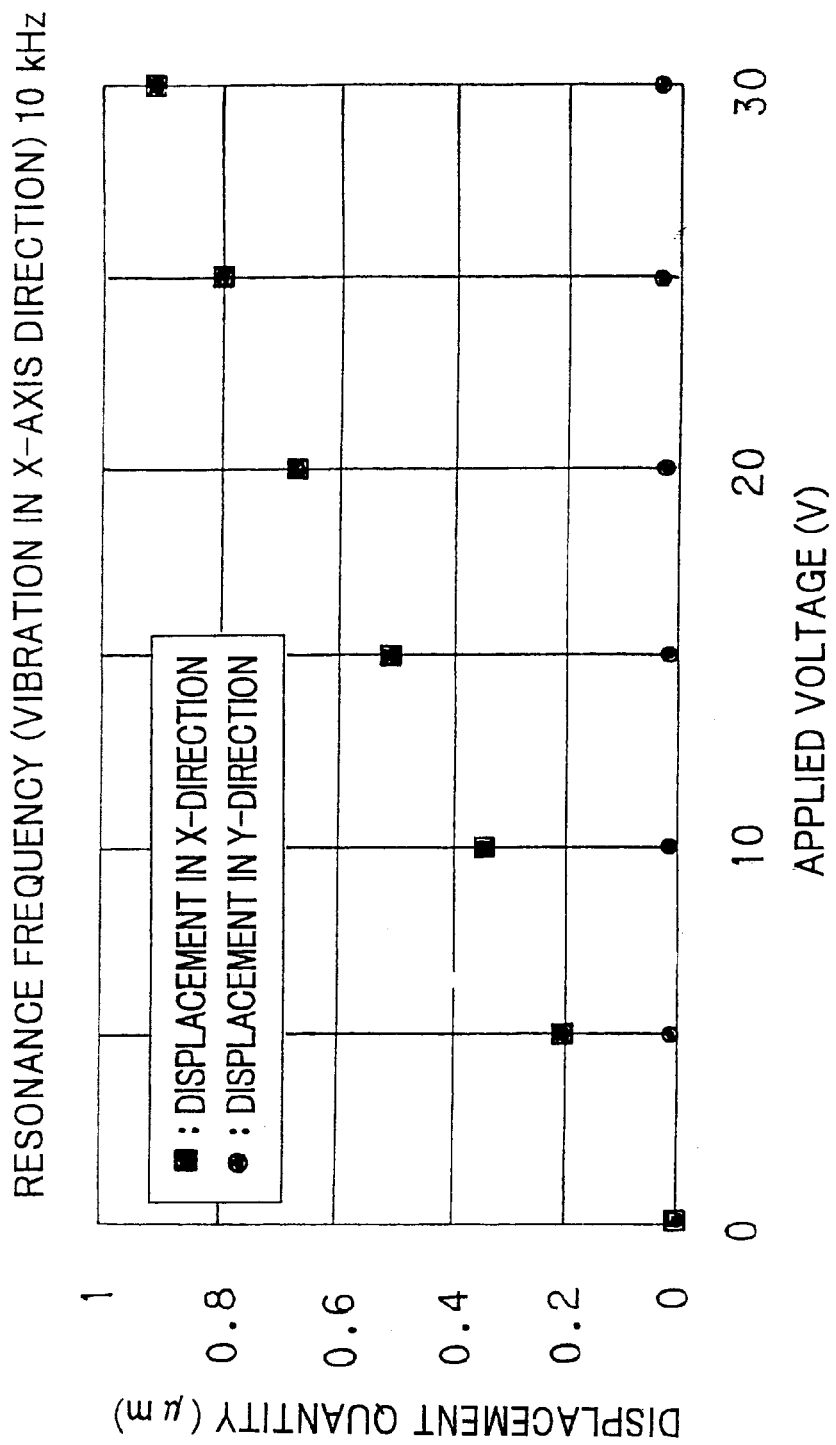
FIG. 27 shows a graph showing measured results of displacement quantities in the X-axis and the Y-axis directions when a pulse voltage is applied to a piezoelectric/electrostrictive device of the present invention by use of the laser Doppler vibrometer.
Figure 33:
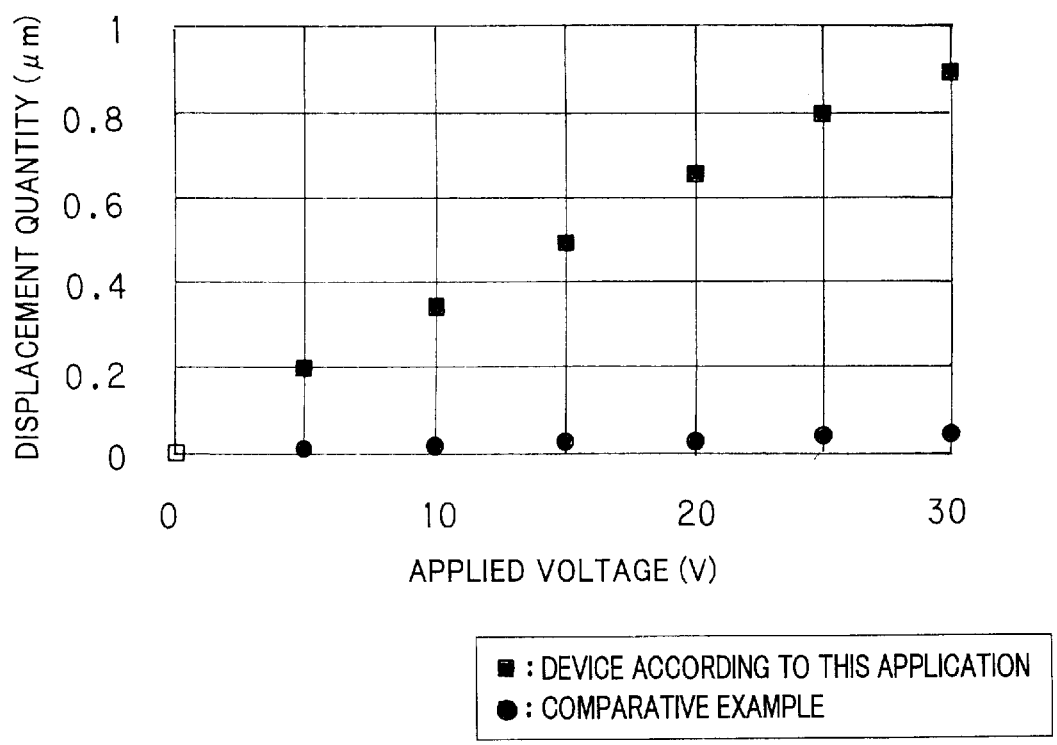
FIG. 33 shows a graph showing displacement quantities relative to voltages applied.
Figure 35:
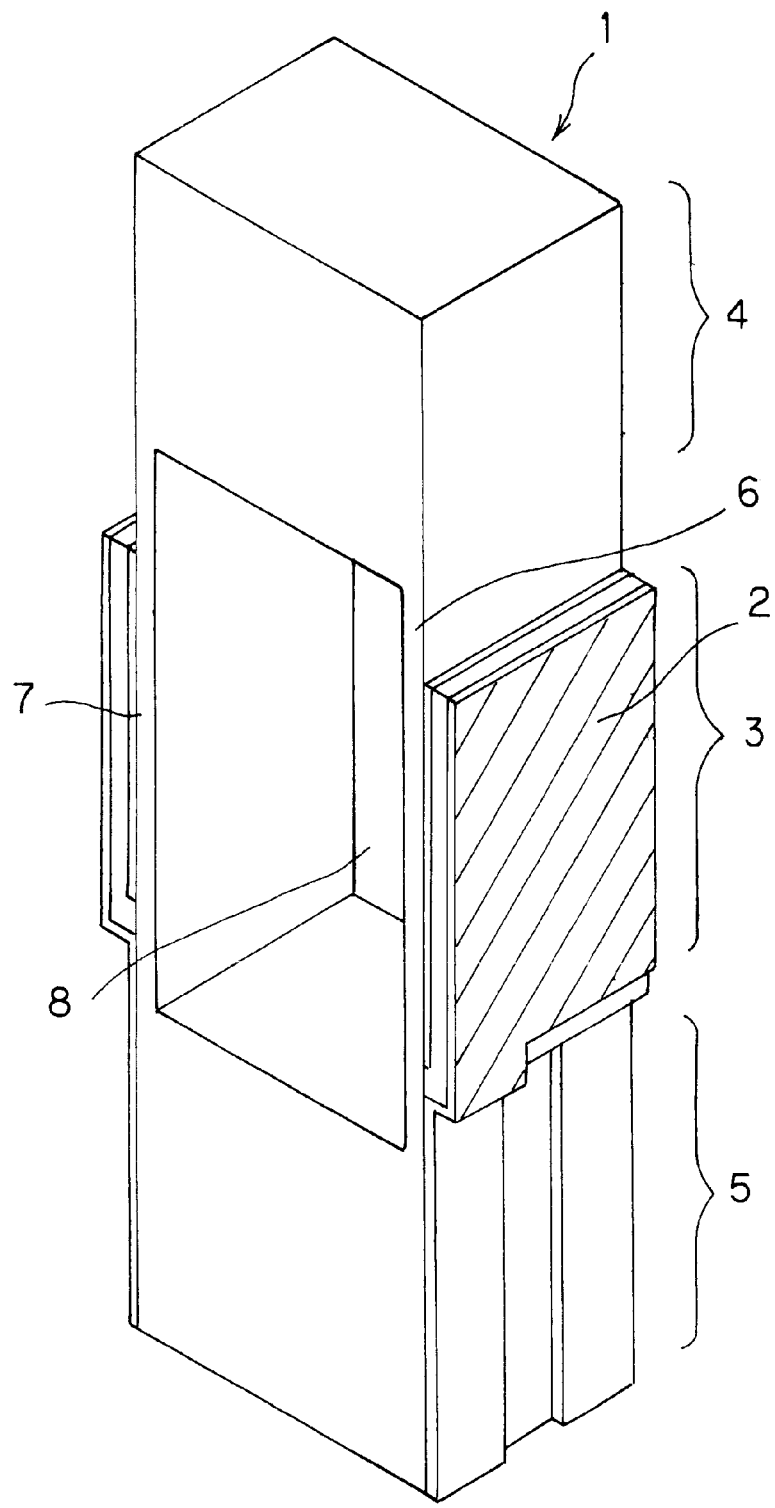
FIG. 35 shows a schematic perspective view of a piezoelectric actuator used as a comparative example.

Displacement quantities of the X-axis direction and the Y-axis direction when a pulse voltage is applied to the piezoelectric element seen on the right of the device are measured by the laser Doppler vibrometer (made by Graphtec Corp). Te he measurement results are shown in FIG. 27. If displacements at an applied voltage of 30 V are compared, the displacement in the Y-axis direction is less than 3% of the displacement in the X-axis, or main axis, direction, and the displacement in the X-axis direction is substantially dominant. Further, the generated displacement is compared with that of the structure having a piezoelectric/electrostrictive operating portion only at the thin plate portion disclosed in JP-A-63-64640. A device structure according to the present application is made similar to the structure shown in FIG. 9, a comparative example is as per FIG. 35, and both devices are of unimorph structure. Except for the difference in mode of providing a piezoelectric element, each of devices is prepared in the methods same as the above-described methods. FIG. 33 shows a graph showing displacement quantities relative to voltages applied. As read from FIG. 33, it can be clearly understood that a device according to the present invention, which has an effect from a piezoelectric/electrostrictive operating portion being extended over to the fixing portion, is remarkably superior in structure for producing a large displacement showing displacements of more than 20 times at every applied voltage, relative to the exemplary structure for comparison where a piezoelectric/electrostrictive operating portion is provided only at a thin plate portion.

A device according to the present invention is characterized by a structure in that the device has higher stiffness in the width direction of the thin plate, namely the Y-axis direction, and therefore, when functional members such as a sensor, a magnetic head, or the like are attached to the present device, and further, when the present device per se is attached to the other structure, the structure permits solid bonding. In addition, because of the stiffness, the device also has a character that members of comparatively large mass can be attached. Furthermore, since the stiffness of the thin plate in the thickness direction is relatively smaller than the stiffness in the width direction, a component in the Y-axis direction, or a flapped direction, of the displacement components at the time when the device is operated based on the directional property of the stiffness, can be effectively suppressed, which is a major advantage of the device. The present invention implements a structure where a piezoelectric/electrostrictive operating portion for developing the displacement is extended over not only to the thin plate portion but also to the fixing and/or movable portion, and a displaced shape of the driving portion takes a shape facing toward the outside space, different from a structure disclosed in JP-A-63-64640 where a thin plate portion faces toward the direction of the hole, in the case of present invention, and therefore the structure allows the movable portion to have a large displacement in the displacement mechanism. Further, the fixing portion, the movable portion, and the thin plate portion of the present device are integrally structured by sintering, and the piezoelectric/electrostrictive element is integrally structured by sintering with the thin plate portion, fixing portion and/or the movable portion by the film forming methods without using an adhesive, and therefore, the device is a structure which does not generate variations such as a displacement drifting or the like over time caused by adhering. Further, as described above, in the device of the present application, a bonding portion of the driving portion or the thin plate portion with the fixing portion, and a bonding portion of the driving portion or the thin plate portion with the movable portion are structurally borderless with no intermediary third substance and/or material, and therefore the structure is of high stiffness easily allowing a higher resonance frequency capable of high speed operation. As noted, the device according to the present application is structurally and functionally entirely different from an actuator disclosed in JP-A-63-64640, and is higher in reliability.

Consequently, the device according to the present invention can be utilized as an active element in various transducers, various actuators, frequency-region functional components (filters), transformers, vibrators and resonators for communication and motive power, oscillators, discriminators, and the like, and as a sensor element for a variety of sensors such as ultrasonic sensors and acceleration sensors, angular velocity sensors and impact sensors, mass sensors, and the like, and particularly can be preferably utilized for a variety of actuators used in mechanisms for displacement, alignment adjustment and angular adjustment of a variety of precision components or the like of optical instruments, precision apparatuses, and the like.

What is claimed is:

1. A piezoelectric/electrostrictive device comprising a driving portion to be driven by a displacement of a piezoelectric/electrostrictive element, a movable portion to be operated by driving said driving portion, and a fixing portion for holding said driving portion and said movable portion, said piezoelectric/electrostrictive device being characterized in that said driving portion comprises a pair of thin plate portions facing each other, and a film-like piezoelectric/electrostrictive element including at least a pair of electrode films and a piezoelectric/electrostrictive film formed on at least a part of the outer surface of at least one of said thin plate portions, said fixing portion is coupled with said movable portion via said driving portion along a length direction of said device, and a hole is defined by an inner wall of said driving portion, an inner wall of said movable portion, and an inner wall of said fixing portion, and has a central axis that extends in an axial direction substantially parallel to said thin plate portions and substantially perpendicular to said length direction, wherein at least one end of a piezoelectric operating portion of said piezoelectric/electrostrictive element in said length direction exists on the fixing portion or the movable portion, and a ratio a/b of the thickness a of said hole and the width b of said thin plate portions, which extends in said axial direction, is 0.5 to 20, and wherein said device is free of any other holes extending in any direction other than said axial direction.

2. A piezoelectric/electrostrictive device according to claim 1, characterized in that the width of said thin plate portions is the same as the width of the piezoelectric/electrostrictive element formed on said thin plate portions.

3. A piezoelectric/electrostrictive device according to claim 1, characterized in that a ratio e/a of the length e of said thin plate portions and the thickness a of said hole is 0.5 to 10.

4. A piezoelectric/electrostrictive device according to claim 1, characterized in that a ratio a/b of the thickness a of said hole and width b of said thin plate portions is 1 to 10, and a ratio e/a of the length e of said thin plate portions and the thickness a of said hole is 0.7 to 5.

5. A piezoelectric/electrostrictive device according to claim 1, wherein the movable portion and the fixing portion are rectangular solid bodies.

6. A piezoelectric/electrostrictive device comprising a movable portion to be driven by a displacement of a piezoelectric/electrostrictive element, a movable portion to be operated by driving said driving portion, and a fixing portion for holding said driving portion and said movable portion, said piezoelectric/eletrostrictive device being characterized in that said driving portion comprises a pair of thin plate portions facing each other, and a film-like piezoelectric/electrostrictive element including at least a pair of electrode films and a piezoelectric/electrostrictive film formed at least on a part of the outer surface of at least one of said thin plate portions, said fixing portion is coupled with said movable portion via said driving portion along a length direction of said device, and a hole is defined by an inner wall of said driving portion, an inner wall of said movable portion, and an inner wall of said fixing portion, and has a central axis that extends in an axial direction substantially parallel to said thin plate portions and substantially perpendicular to said length direction, wherein at least one end of a piezoelectric operating portion of said piezoelectric/electrostrictive element in said length direction exists on the fixing portion or the movable portion, and the thickness a of said hole is 100 $\mu$m to 2000 $\mu$m, and the width b of said thin plate portions, which extends in said axial direction, is 50 $\mu$m to 2000 $\mu$m, and wherein said device is free of any other holes extending in any direction other than said axial direction.

7. A piezoelectric/electrostrictive device according to claim 6, characterized in that the thickness a of said hole is 200 $\mu$m to 1000 $\mu$m, and the width b of said thin plate portions is 100 $\mu$m to 500 $\mu$m.

8. A piezoelectric/electrostrictive device according to claim 6, characterized in that the width b of said thin plate portions is larger than the thickness d thereof, and the thickness d of said thin plate portions is 2 $\mu$m to 100 $\mu$m.

9. A piezoelectric/electrostrictive device according to claim 6, characterized in that the length e of said thin plate portions is 200 $\mu$m to 3000 $\mu$m.

10. A piezoelectric/electrostrictive device according to claim 6, characterized in that the length f of said movable portion is 50 $\mu$m to 2000 $\mu$m.

11. A piezoelectric/electrostrictive device according to claim 1, wherein said piezoelectric/electrostrictive device has at least two driving portions.

12. A piezoelectric/electrostrictive device according to claims 1, wherein said piezoelectricl/electrostrictive element is a laminated type piezoelectric/electrostrictive element laminated in layers by a lower electrode film, a piezoelectric/electrostrictive film, and an upper electrode film.

13. A piezoelectric/electrostrictive device according to claim 1, wherein said piezoelectric/electrostrictive element is structured to comprise a piezoelectric/electrostrictive film and a first electrode film and a second electrode film formed on at least one main surface of said piezoelectric/electrostrictive film.

14. A piezoelectric/electrostrictive device according to claim 1, wherein said electrode films are comb-structure, and are interleaved with a predetermined width between respective teeth of each comb.

15. A piezoelectric/electrostrictive device according to claims 1, wherein the movable portion, the thin plate portion, and the fixing portion comprise an integrally formed ceramic.

16. A piezoelectric/electrostrictive device according to claim 15, wherein said ceramic is a laminate.

17. A piezoelectric/electrostrictive device according to claim 1, characterized in that at least one end in said length direction of a piezoelectric operating portion of said piezoelectric/electrostrictive element exists on the movable portion or the fixing portion from a bonded portion of the movable portion or the fixing portion with the thin plate portions over a distance of at least one half of the thickness d of said thin plate portions.

18. A piezoelectric/electrostrictive device according to claim 2, characterized in that a ratio e/a of the length e of said thin plate portions and the thickness a of said hole is 0.5 to 10.

19. A piezoelectric/electrostrictive device according to claim 2, characterized in that a ratio a/b of the thickness a of said hole and width b of said thin plate portions is 1 to 10, and a ratio e/a of the length e of said thin plate portions and the thickness a of said hole is 0.7 to 5.

20. A piezoelectric/electrostrictive device according to claim 3, characterized in that a ratio a/b of the thickness a of said hole and width b of said thin plate portions is 1 to 10, and a ratio e/a of the length e of said thin plate portions and the thickness a of said hole is 0.7 to 5.

21. A piezoelectric/electrostrictive device according to claim 18, characterized in that a ratio a/b of the thickness a of said hole and width b of said thin plate portions is 1 to 10, and a ratio e/a of the length e of said thin plate portions and the thickness a of said hole is 0.7 to 5.

22. A piezoelectric/electrostrictive device according to claim 2, wherein the movable portion and the fixing portion are rectangular solid bodies.

23. A piezoelectric/electrostrictive device according to claim 3, wherein the movable portion and the fixing portion are rectangular solid bodies.

24. A piezoelectric/electrostrictive device according to claim 4, wherein the movable portion and the fixing portion are rectangular solid bodies.

25. A piezoelectric/electrostrictive device according to claim 19, wherein the movable portion and the fixing portion are rectangular solid bodies.

26. A piezoelectric/electrostrictive device according to claim 18, wherein the movable portion and the fixing portion are rectangular solid bodies.

27. A piezoelectric/electrostrictive device according to claim 21, wherein the movable portion and the fixing portion are rectangular solid bodies.

28. A piezoelectric/electrostrictive device according to claim 20, wherein the movable portion and the fixing portion are rectangular solid bodies.

29. A piezoelectric/electrostrictive device according to claim 7, characterized in that the width b of said thin plate portions is larger than the thickness d thereof, and the thickness d of said thin plate portions is 2 $\mu$m to 100 $\mu$m.

30. A piezoelectric/electrostrictive device according to claim 7, characterized in that the length e of said thin plate portions is 200 $\mu$m to 3000 $\mu$m.

31. A piezoelectric/electrostrictive device according to claim 8, characterized in that the length e of said thin plate portions is 200 $\mu$m to 3000 $\mu$m.

32. A piezoelectric/electrostrictive device according to claim 29, characterized in that the length e of said thin plate portions is 200 $\mu$m to 3000 $\mu$m.

33. A piezoelectric/electrostrictive device according to claim 9, characterized in that the length f of said movable portion is 50 $\mu$m to 2000 $\mu$m.

34. A piezoelectric/electrostrictive device according to claim 7, characterized in that the length f of said movable portion is 50 $\mu$m to 2000 $\mu$m.

35. A piezoelectric/electrostrictive device according to claim 30, characterized in that the length f of said movable portion is 50 $\mu$m to 2000 $\mu$m.

36. A piezoelectric/electrostrictive device according to claim 32, characterized in that the length f of said movable portion is 50 $\mu$m to 2000 $\mu$m.

37. A piezoelectric/electrostrictive device according to claim 29, characterized in that the length f of said movable portion is 50 $\mu$m to 2000 $\mu$m.

38. A piezoelectric/electrostrictive device according to claim 31, characterized in that the length f of said movable portion is 50 $\mu$m to 2000 $\mu$m.

39. A piezoelectric/electrostrictive device according to claim 8, characterized in that the length f of said movable portion is 50 $\mu$m to 2000 $\mu$m.

40. A piezoelectric/electrostrictive device according to claim 6, wherein said piezoelectric/electrostrictive device has at least two driving portions.

41. A piezoelectric/electrostrictive device according to claim 6, wherein said piezoelectric/electrostrictive element is a laminated type piezoelectric/electrostrictive element laminated in layers by a lower electrode film, a piezoelectric/electrostrictive film, and an upper electrode film.

42. A piezoelectric/electrostrictive device according to claim 6, wherein said piezoelectric/electrostrictive element is structured to comprise a piezoelectric/electrostrictive film and a first electrode film and a second electrode film formed on at least one main surface of said piezoelectric/electrostrictive film.

43. A piezoelectric/electrostrictive device according to claim 6, wherein the movable portion, the thin plate portion, and the fixing portion comprise an integrally formed ceramic.

44. A piezoelectric /electrostrictive device according to claim 43, wherein said ceramic is a laminate.

45. A piezoelectric/electrostrictive device according to claim 6, characterized in that at least one end in said length direction of a piezoelectric operating portion of said piezoelectric/electrostrictive element exists on the movable portion or the fixing portion from a bonded portion of the movable portion or the fixing portion with the thin plate portions over a distance of at least one half of the thickness d of said thin plate portions.

* * * * *